(12) United States Patent
Luo et al.

(10) Patent No.: US 12,707,719 B2
(45) Date of Patent: Aug. 11, 2026

(54) DRIVING BACKPLANE INCLUDING REFLECTIVE LAYER AND METHOD FOR MANUFACTURING THE SAME, AND DISPLAY DEVICE

(71) Applicants: BOE MLED Technology Co., Ltd., Beijing (CN); BOE TECHNOLOGY GROUP CO., LTD., Beijing (CN)

(72) Inventors: Zhenxing Luo, Beijing (CN); Junjie Xie, Beijing (CN); Bin Xiang, Beijing (CN); Yezhou Tan, Beijing (CN); Chengguo Wang, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 775 days.

(21) Appl. No.: 18/042,911

(22) PCT Filed: Feb. 25, 2022

(86) PCT No.: PCT/CN2022/078095
§ 371 (c)(1),
(2) Date: Feb. 24, 2023

(87) PCT Pub. No.: WO2023/159523
PCT Pub. Date: Aug. 31, 2023

(65) Prior Publication Data
US 2024/0274621 A1 Aug. 15, 2024

(51) Int. Cl.
*H01L 27/15* (2006.01)
*H01L 29/26* (2006.01)
(Continued)

(52) U.S. Cl.
CPC ........... *H10D 86/60* (2025.01); *H10D 86/443* (2025.01); *H10H 20/841* (2025.01);
(Continued)

(58) Field of Classification Search
CPC .. H10D 86/443; H10H 20/841; H10H 20/857; H01L 24/02–09;
(Continued)

(56) References Cited

U.S. PATENT DOCUMENTS 6,169,253 B1 * 1/2001 Jairazbhoy ........... H05K 3/3442 361/767
7,916,495 B2 * 3/2011 Huang .................. H05K 1/111 361/767

(Continued)

*Primary Examiner* — Ismail A Muse
(74) *Attorney, Agent, or Firm* — XSENSUS LLP

(57) ABSTRACT

A driving backplane includes a substrate, pad groups and line groups. A line of each line group is connected to a pad of a pad group. At least one pad of a pad group and a line connected thereto define line hollowed-out regions. The line hollowed-out regions include a first line hollowed-out region and a second line hollowed-out region that are disposed on two sides of the pad(s) in a second direction. The driving backplane further includes a reflective layer covering a first surface of the substrate and the line groups. Each window region in the reflective layer includes a first region, a second region and a third region that are arranged in the second direction. The second region exposes a pad group and a pad spacer region corresponding to the pad group, and the first region and the third region expose portions of the first surface of the substrate.

19 Claims, 17 Drawing Sheets

(51) Int. Cl.

| | |
|---|---|
| ***H01L 31/12*** | (2006.01) |
| ***H01L 33/00*** | (2010.01) |
| ***H10D 86/40*** | (2025.01) |
| ***H10D 86/60*** | (2025.01) |
| ***H10H 20/841*** | (2025.01) |
| ***H10H 20/857*** | (2025.01) |
| ***H10W 90/00*** | (2026.01) |
| *H10H 20/01* | (2025.01) |

(52) U.S. Cl.
CPC .......... *H10H 20/857* (2025.01); *H10W 90/00* (2026.01); *H10H 20/034* (2025.01); *H10H 20/0364* (2025.01)

(58) Field of Classification Search
CPC ........................... H01L 2224/02–09519; H01L 2224/0812–08123; H01L 2224/0603; H01L 2224/05005; H01L 2224/05001–05499; H01L 2224/0801
See application file for complete search history.

(56) References Cited

U.S. PATENT DOCUMENTS 10,154,589 B2 * 12/2018 Hiraoka ................. H05K 1/181
2003/0184986 A1 * 10/2003 Soga .................... H05K 3/3452 361/767
2011/0292625 A1 * 12/2011 Chen ...................... H05K 1/111 361/768
2016/0029485 A1 * 1/2016 Dummer .............. H05K 1/0295 362/382

* cited by examiner

E
92a1~92a
911~91
92a2~92a
921~92
d10
d11
Ab2
Cb2
911a
911a
311a~311
d4
d14
h
d4
912~91
91a
912a
912a
Ab2
Cb2
d12
d13
Y
922~92
X
d15
ZZ
d15

DRIVING BACKPLANE INCLUDING REFLECTIVE LAYER AND METHOD FOR MANUFACTURING THE SAME, AND DISPLAY DEVICE

CROSS-REFERENCE TO RELATED APPLICATION

This application is a national phase entry under 35 USC 371 of International Patent Application No. PCT/CN2022/078095, filed on Feb. 25, 2022, which is incorporated herein by reference in its entirety.

TECHNICAL FIELD

The present disclosure relates to the field of display technologies, and in particular, to a driving backplane and a method for manufacturing the same, and a display device.

BACKGROUND

Light-emitting diodes (LEDs) have advantages of small size, high brightness, low power consumption, low heat generation, long service life and pro-environment, and play an indispensable role as backlight units in electronic products (such as mobile phones, televisions and computers) requiring backlight display. Considering mini-LEDs as an example, mini-LED display devices have become a hot spot developed in the current market due to their advantages such as ultra thinness, high brightness, energy saving and high color gamut.

SUMMARY

In an aspect, a driving backplane is provided. The driving backplane includes a substrate, a plurality of pad groups, a plurality of line groups and a reflective layer. The plurality of pad groups are arranged in an array on a first surface of the substrate, and each of the plurality of pad groups includes two pads spaced apart in a first direction. The two pads have a pad spacer region therebetween. The plurality of line groups are disposed on the first surface of the substrate, each line group includes two lines, and a line of each line group is connected to a pad of a single pad group. At least one pad of a pad group and a line connected thereto define line hollowed-out regions. The line hollowed-out regions include a first line hollowed-out region and a second line hollowed-out region. The first line hollowed-out region and the second line hollowed-out region are disposed on two sides of the at least one pad in a second direction, respectively. Dimensions of the first line hollowed-out region and the second line hollowed-out region in the first direction are each greater than a dimension of a pad spacer region corresponding to the pad group in the first direction. The second direction is perpendicular to the first direction, and the second direction and the first direction are parallel to the first surface of the substrate.

The reflective layer covers the first surface of the substrate and the plurality of line groups, the reflective layer is provided with a plurality of window regions therein, and each window region includes a first region, a second region and a third region that are arranged in the second direction. The second region exposes a respective pad group and a pad spacer region corresponding to the respective pad group. The first region and the third region expose portions of the first surface of the substrate. In the second direction, a boundary of an orthogonal projection of the first line hollowed-out region on the substrate away from the respective pad group is farther away from the respective pad group than a boundary of an orthogonal projection of the first region on the substrate away from the respective pad group. In the second direction, a boundary of an orthogonal projection of the second line hollowed-out region on the substrate away from the respective pad group is farther away from the respective pad group than a boundary of an orthogonal projection of the third region on the substrate away from the respective pad group.

In some embodiments, the line hollowed-out regions are defined by two pads of the pad group and a line group connected thereto; and the first line hollowed-out region and the second line hollowed-out region are disposed on two sides of the pad group in the second direction, respectively.

In some embodiments, a distance in the second direction between the boundary of the orthogonal projection of the first line hollowed-out region on the substrate away from the pad group and the boundary of the orthogonal projection of the first region on the substrate away from the pad group is greater than 1.2 times a distance in a third direction between a surface of the reflective layer away from the substrate and the first surface of the substrate; a distance in the second direction between the boundary of the orthogonal projection of the second line hollowed-out region on the substrate away from the pad group and the boundary of the orthogonal projection of the third region on the substrate away from the pad group is greater than 1.2 times the distance in the third direction between the surface of the reflective layer away from the substrate and the first surface of the substrate; and the third direction is perpendicular to a plane where the substrate is located.

In some embodiments, dimensions of the first region and the third region in the second direction are each in a range from 0.05 mm to 0.1 mm.

In some embodiments, two opposite second boundaries of the first line hollowed-out region in the first direction are farther away from the pad spacer region corresponding to the pad group than two opposite first boundaries of the orthogonal projection of the first region on the substrate in the first direction; and two opposite fourth boundaries of the second line hollowed-out region in the first direction are farther away from the pad spacer region corresponding to the pad group than two opposite third boundaries of the orthogonal projection of the third region on the substrate in the first direction.

In some embodiments, in the two opposite first boundaries of the orthogonal projection of the first region on the substrate in the first direction, and in the two opposite second boundaries of the first line hollowed-out region in the first direction, a distance in the first direction between a first boundary and a second boundary on a same side of the pad spacer region corresponding to the pad group is greater than 1.2 times a distance in a third direction between a surface of the reflective layer away from the substrate and the first surface of the substrate. And/or, in the two opposite third boundaries of the orthogonal projection of the third region on the substrate in the first direction, and in the two opposite fourth boundaries of the second line hollowed-out region in the first direction, a distance in the first direction between a third boundary and a fourth boundary on a same side of the pad spacer region corresponding to the pad group is greater than 1.2 times the distance in the third direction between the surface of the reflective layer away from the substrate and the first surface of the substrate.

In some embodiments, the two pads of each of the plurality of pad groups are a first pad and a second pad. In two opposite second boundaries of the first line hollowed-out region in the first direction, a second boundary located on a same side of the pad spacer region corresponding to the pad group as a first pad of the pad group is farther away from the pad spacer region corresponding to the pad group than an edge of the first pad of the pad group away from the pad spacer region corresponding to the pad group; and/or another second boundary located on a same side of the pad spacer region corresponding to the pad group as a second pad of the pad group is farther away from the pad spacer region corresponding to the pad group than an edge of the second pad of the pad group away from the pad spacer region corresponding to the pad group; and/or a fourth boundary located on a same side of the pad spacer region corresponding to the pad group as the first pad of the pad group is farther away from the pad spacer region corresponding to the pad group than the edge of the first pad of the pad group away from the pad spacer region corresponding to the pad group; and/or another fourth boundary located on a same side of the pad spacer region corresponding to the pad group as the second pad of the pad group is farther away from the pad spacer region corresponding to the pad group than the edge of the second pad of the pad group away from the pad spacer region corresponding to the pad group.

In some embodiments, in the two opposite second boundaries of the first line hollowed-out region in the first direction, and in the two opposite fourth boundaries of the second line hollowed-out region in the first direction, a distance in the first direction between the second boundary located on the same side of the pad spacer region corresponding to the pad group as the first pad of the pad group and the edge of the first pad of the pad group away from the pad spacer region corresponding to the pad group, and a distance in the first direction between the fourth boundary located on the same side of the pad spacer region corresponding to the pad group as the first pad of the pad group and the edge of the first pad of the pad group away from the pad spacer region corresponding to the pad group, are each in a range from 0.04 mm to 0.06 mm; and/or a distance in the first direction between the another second boundary located on the same side of the pad spacer region corresponding to the pad group as the second pad of the pad group and the edge of the second pad of the pad group away from the pad spacer region corresponding to the pad group, and a distance in the first direction between the another fourth boundary located on the same side of the pad spacer region corresponding to the pad group as the second pad of the pad group and the edge of the second pad of the pad group away from the pad spacer region corresponding to the pad group, are each in a range from 0.04 mm to 0.06 mm.

In some embodiments, dimensions of the first line hollowed-out region and the second line hollowed-out region in the second direction are each greater than 0.15 mm.

In some embodiments, the first line hollowed-out region and the second line hollowed-out region are symmetrically arranged with respect to the pad group.

In some embodiments, shapes of orthogonal projections of the first pad and the second pad on the substrate are both rectangle.

In some embodiments, a shape of an orthogonal projection of the window region on the substrate is rectangle.

In some embodiments, the driving backplane further includes a plurality of first connection solder paste patterns and a plurality of second connection solder paste patterns; and each first connection solder paste pattern covers a respective first pad, and each second connection solder paste pattern covers a respective second pad.

In some embodiments, the driving backplane further includes a plurality of light-emitting chips, and each light-emitting chip is electrically connected to respective one of the plurality of pad groups by a single first connection solder paste pattern and a single second connection solder paste pattern.

In some embodiments, the reflective layer includes a first reflective layer and a second reflective layer stacked on a surface of the first reflective layer away from the substrate.

In some embodiments, the reflective layer has a gap proximate to an edge of the window region; a maximum dimension of the gap in a third direction is ½ to ⅔ of a thickness of the reflective layer, and a dimension of the gap in the second direction is 1.1 to 1.2 times the thickness of the reflective layer; and the third direction is a direction perpendicular to a plane where the substrate is located.

In another aspect, a method for manufacturing a driving backplane is provided. The method includes: forming a substrate; forming a line layer on a first surface of the substrate, the line layer including a plurality of line groups and a plurality of groups of pads, the plurality of pad groups being arranged in an array on the first surface of the substrate, each pad group including two pads spaced apart in a first direction; the two pads having a pad spacer region therebetween, the plurality of line groups being disposed on the first surface of the substrate, each line group including two lines, a line of each line group being connected to a pad of a pad group, at least one pad of a pad group and a line of a line group connected thereto defining line hollowed-out regions including a first line hollowed-out region and a second line hollowed-out region, the first line hollowed-out region and the second line hollowed-out region being respectively disposed on two sides of the at least one pad in a second direction, dimensions of the first line hollowed-out region and the second line hollowed-out region in the first direction being each greater than a dimension of a pad spacer region corresponding to the pad group in the first direction, the second direction being perpendicular to the first direction, and the second direction and the first direction being parallel to the first surface of the substrate; and forming a reflective layer on the first surface of the substrate, the reflective layer covering the first surface of the substrate and the plurality of line groups, the reflective layer being provided with a plurality of window regions therein, each window region including a first region, a second region and a third region that are arranged in the second direction, the second region exposing a respective pad group and a pad spacer region corresponding to the respective pad group, the first region and the third region exposing portions of the first surface of the substrate, a boundary of an orthogonal projection of the first line hollowed-out region on the substrate away from the pad group being farther away from the respective pad group than a boundary of an orthogonal projection of the first region on the substrate away from the respective pad group in the second direction, a boundary of an orthogonal projection of the second line hollowed-out region on the substrate away from the respective pad group being farther away from the pad group than a boundary of an orthogonal projection of the third region on the substrate away from the respective pad group in the second direction; and forming a connection solder paste pattern on each pad.

In some embodiments, forming the reflective layer on the first surface of the substrate includes forming a first reflective layer on the first surface of the substrate and forming a second reflective layer on a surface of the first reflective layer away from the first surface.

In yet another aspect, a display device is provided. The display device includes the driving backplane as described above.

BRIEF DESCRIPTION OF THE DRAWINGS

In order to describe technical solutions in the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art can obtain other drawings according to these drawings. In addition, accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
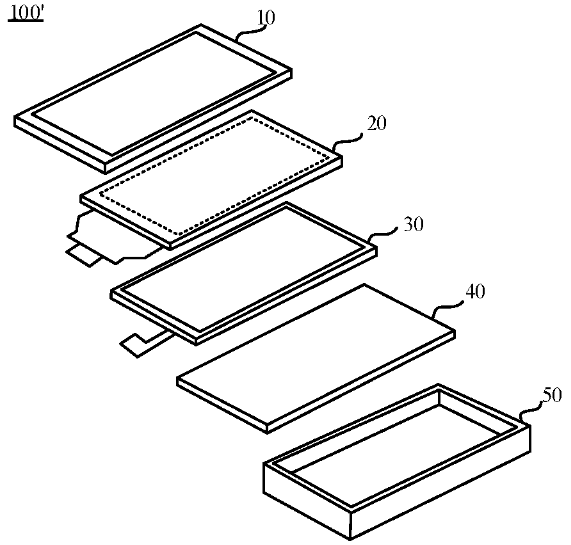
FIG. 1 is a structural diagram of a display device, in accordance with some embodiments of the related art.

Technical solutions in some embodiments of the present disclosure will be described clearly and completely in combination with accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the description and claims, the term “comprise/include” and other forms thereof such as the third-person singular form “comprises/includes” and the present participle form “comprising/including" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to same embodiment(s) or example(s). In addition, the specific features, structures, materials or characteristics may be included in any or more embodiments or examples in any suitable manner.

Hereinafter, the terms such as "first" and "second" are used for descriptive purposes only, and are not to be construed as indicating or implying a relative importance or implicitly indicating the number of indicated technical features. Thus, a feature defined with the term "first" or "second" may explicitly or implicitly include one or more of the features. In the description of the embodiments of the present disclosure, the term "a plurality of" or "the plurality of" means two or more unless otherwise specified.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

In addition, the use of the phrase "based on" or "according to" is meant to be open and inclusive, since a process, step, calculation or other action that is "based on" or "according to" one or more of the stated conditions or values may, in practice, be based on additional conditions or values exceeding those stated.

As used herein, the term "about", "substantially" or "approximately" includes a stated value and an average value within an acceptable range of deviation of a particular value determined by a person of ordinary skill in the art, considering measurement in question and errors associated with measurement of a particular quantity (i.e., limitations of a measurement system).

As used herein, "parallel", "perpendicular" and "equal" include the stated conditions and the conditions similar to the stated conditions, and the range of the similar conditions is within the acceptable deviation range, where the acceptable deviation range is determined by a person of ordinary skill in the art in consideration of the measurement in question and the error associated with the measurement of a specific quantity (i.e., the limitation of the measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, that a difference between two equals is less than or equal to 5% of either of the two equals.

It will be understood that when a layer or element is referred to as being on another layer or a substrate, it is possible that the layer or element is directly on the another layer or the substrate, and it is also possible that intervening layer(s) are present between the layer or element and the another layer or the substrate.

Exemplary embodiments are described herein with reference to sectional views and/or plan views as idealized exemplary drawings. In the accompanying drawings, thicknesses of layers and sizes of regions are enlarged for clarity. Thus, variations in shapes relative to the accompanying drawings due to, for example, manufacturing technologies and/or tolerances may be envisaged. Therefore, the exemplary embodiments should not be construed as being limited to the shapes of the regions shown here, but including deviations in the shapes due to, for example, manufacturing. For example, an etched region shown in a rectangular shape generally has a feature being curved. Therefore, the regions shown in the accompanying drawings are schematic in nature, and their shapes are not intended to show actual shapes of regions in a device, and are not intended to limit the scope of the exemplary embodiments.

Mini-LED display devices have many advantages, such as ultra thinness, high brightness, energy saving and high color gamut, and have become a hot spot developed in the current market. In the related art, considering an example in which a display device 100' is a mobile phone, as shown in FIG. 1, the display device 100' includes a cover plate 10, a liquid crystal display screen 20, a backlight unit (BLU) 30, a middle frame 40 and a housing 50, and the liquid crystal display screen 20, the BLU 30 and the middle frame 40 are disposed in the housing 50.

Figure 2:
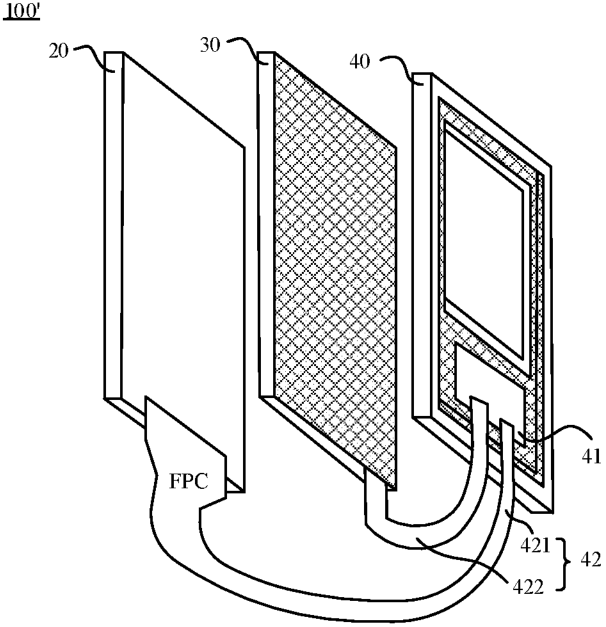
FIG. 2 is a structural diagram of a display device, in accordance with some embodiments.

The middle frame 40 is located between the BLU 30 and the housing 50. As shown in FIG. 2, a surface of the middle frame 40 away from the BLU 30 is used for mounting internal components such as a main board 41. The main board 41 is used for providing electrical signals for the BLU 30 and the liquid crystal display screen 20. The liquid crystal display screen 20 and the BLU 30 are electrically connected to the main board 41 through flexible printed circuits (FPCs) 42; for example, the liquid crystal display screen 20 is electrically connected to the main board 41 through a first FPC 421, and the BLU 30 is electrically connected to the main board 41 through a second FPC 422.

The liquid crystal display screen 20 has a light-emitting side from which a display image can be seen and a back side arranged opposite to the light-emitting side. The cover plate 10 is located on the light-emitting side of the liquid crystal display screen 20 for protecting the liquid crystal display screen 20, and the cover plate 10 and the liquid crystal display screen 20 may be bonded by an optically clear adhesive (OCA).

For example, the cover plate 10 may be, for example, a cover glass (CG), which may have certain toughness.

Figure 3:
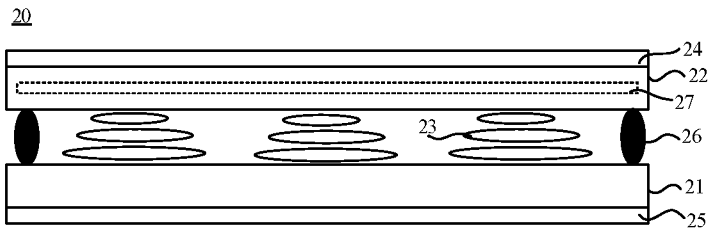
FIG. 3 is a structural diagram of a liquid crystal display screen, in accordance with some embodiments.

In some examples, as shown in FIG. 3, the liquid crystal display screen 20 includes an array substrate 21, an opposite substrate 22, a liquid crystal layer 23, an upper polarization layer 24 and a lower polarization layer 25. The liquid crystal layer 23 is disposed between the array substrate 21 and the opposite substrate 22. The array substrate 21 and the opposite substrate 22 are bonded together by a sealant 26, so that the liquid crystal layer 23 is disposed in a liquid crystal cell enclosed by the array substrate 21, the opposite substrate 22 and the sealant 26.

In order to achieve the color display of the liquid crystal display screen 20, as shown in FIG. 3, the liquid crystal display screen 20 further includes a color filter layer 27. The color filter layer 27 may be disposed on the opposite substrate 22, and in this case, the opposite substrate 22 may be referred to as a color filter substrate.

For example, the BLU 30 is located on a back side of the liquid crystal display screen 20 for providing a light source for the liquid crystal display screen 20.

Figure 4:
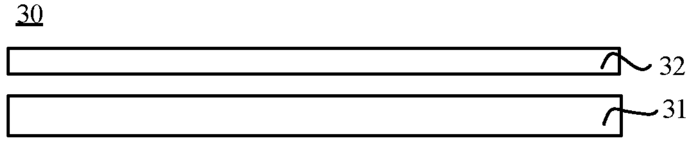
FIG. 4 is a structural diagram of a backlight unit, in accordance with some embodiments.

In some examples, as shown in FIG. 4, the BLU 30 includes a driving backplane 31 and an optical film layer 32 disposed on a light-emitting side of the driving backplane 31.

Figure 5:
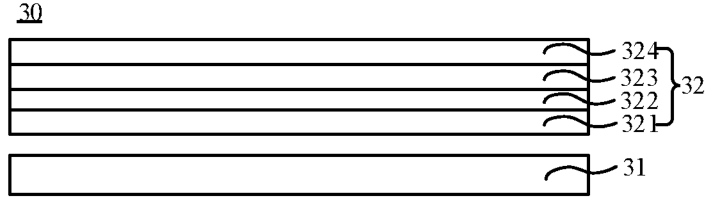
FIG. 5 is a structural diagram of another backlight unit, in accordance with some embodiments.

For example, as shown in FIG. 5, the driving backplane 31 is a blue light driving backplane, and the optical film layer 32 includes a semi-transparent and semi-reflective film 321, a quantum dot (QD)/fluorescent film 322, a diffusion sheet 323 and a prism sheet 324. The semi-transparent and semi-reflective film 321 and the QD/fluorescent film 322 are color conversion films of the blue light driving backplane, which may emit white light when blue light is incident thereon; the diffusion sheet 323 is used for mixing light, and the prism sheet 324 may increase the brightness in a positive viewing angle direction.

Figure 6:
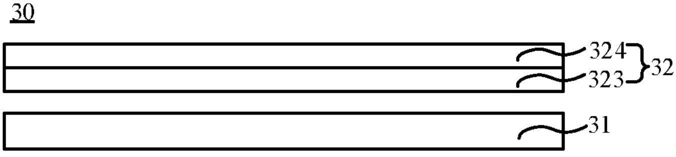
FIG. 6 is a structural diagram of yet another backlight unit, in accordance with some embodiments.

Alternatively, as shown in FIG. 6, the driving backplane 31 is a white light driving backplane, and the optical film layer 32 includes the diffusion sheet 323 and the prism sheet 324. Since the white light driving backplane does not need to convert color light into white light, there is no need to provide the semi-transparent and semi-reflective film 321 and the QD/fluorescent film 322 on the driving backplane 31 of the white light driving backplane.

It will be seen from the above description that the optical film layer 32 in the BLU 30 plays a light-adjusting role, and the driving backplane 31 is used for providing a light source; therefore, the quality of the driving backplane 31 is one of the key factors affecting the yield of a display device 100'.

Figure 7:
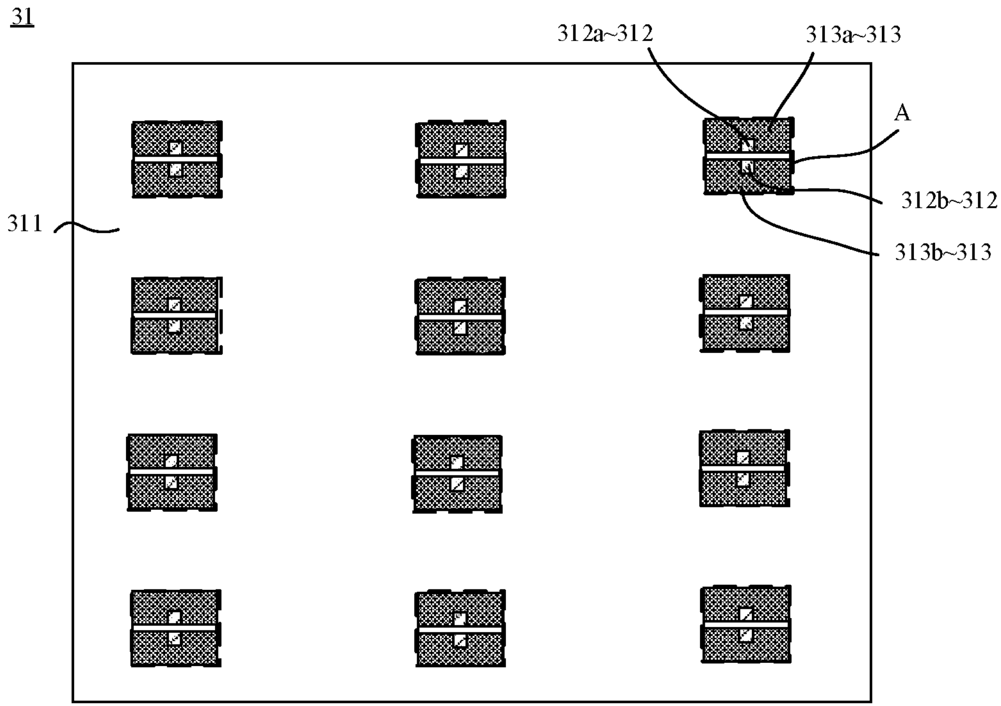
FIG. 7 is a structural diagram of a driving backplane, in accordance with some embodiments of the related art.
Figure 8:
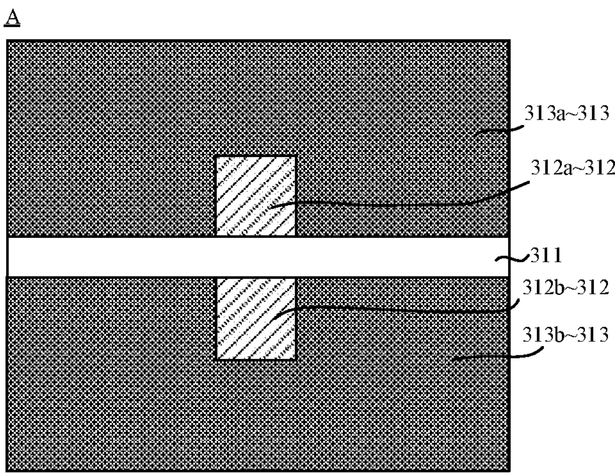
FIG. 8 is an enlarged view of part A of the driving backplane in FIG. 7, in accordance with some embodiments of the related art.

In the related art, as shown in FIG. 7, the driving backplane 31 includes a substrate 311, a plurality of pad groups 312 and a plurality of line groups 313. It will be noted that, only a structure of the driving backplane 31 located in an inner region of a dashed box A is shown in FIG. 7, and a structure of the driving backplane 31 located in an outer region of the dashed box A is not limited, and thus the structure of the driving backplane 31 located in the outer region of the dashed box A is not shown in FIG. 7. The plurality of pad groups 312 are arranged in an array on a surface of the substrate 311, and each pad group 312 includes two pads spaced apart. The two pads are a P-electrode pad 312*a* and an N-electrode pad 312*b*. The plurality of line groups 313 are disposed on the surface of the substrate 311, and each line group 313 includes a P-electrode line 313*a* and an N-electrode line 313*b*. As shown in FIGS. 7 and 8, a P-electrode line 313*a* of a line group 313 is connected to a P-electrode pad 312*a* of a pad group 312, and an N-electrode line 313*b* of a line group 313 is connected to an N-electrode pad 312*b* of a pad group 312.

It will be noted that in the related art, a pad and a corresponding line are integrally provided. That is to say, a P-electrode pad 312*a* and a corresponding P-electrode line 313*a* are an integral structure, e.g., a P-electrode integral conductive structure. The P-electrode pad 312*a* is a portion of the P-electrode integral conductive structure. A portion of the P-electrode integral conductive structure proximate to an edge of a corresponding N-electrode line 313*b* is subjected to an electroless nickel immersion gold (ENIG) process or an organic solderability preservatives (OSP) process to form the P-electrode pad 312*a*, and a remaining portion of the P-electrode integral conductive structure serves as the P-electrode line 313*a*. Similarly, an N-electrode pad 312*b* and a corresponding N-electrode line 313*b* are an integral structure, e.g., an N-electrode integral conductive structure. The N-electrode pad 312*a* is a portion of the N-electrode integral conductive structure. A portion of the N-electrode integral conductive structure proximate to an edge of a corresponding P-electrode line 313*a* is subjected to an ENIG process or an OSP process to form the N-electrode pad 312*b*, and a remaining portion of the N-electrode integral conductive structure serves as the N-electrode line 313*a*.

It will be understood that the above description A "corresponds to" B has the following meanings. In a case where A is connected to B, B corresponding to A refers to B connected to A. In a case where A and B belong to the same group, B corresponding to A refers to B belonging to the same group as A. For example, the same group refers to the same pad group 312 or the same line group 313.

For example, referring again to FIG. 8, a shape of the P-electrode pad 312*a* is rectangle, and except for an edge of the P-electrode pad 312*a* facing the corresponding N-electrode pad 312*b*, three other sides of the P-electrode pad 312*a* and the corresponding P-electrode line 313*a* are connected into an integrated structure. A shape of the N-electrode pad 312*b* is rectangle, and except for an edge of the N-electrode pad 312*b* facing the corresponding P-electrode pad 312*a*, three other edges of the N-electrode pad 312*b* and the corresponding N-electrode line 313*b* are connected into an integrated structure.

For example, the substrate 311 may be, for example, a printed circuit board (PCB) or an FPC.

Figure 9:
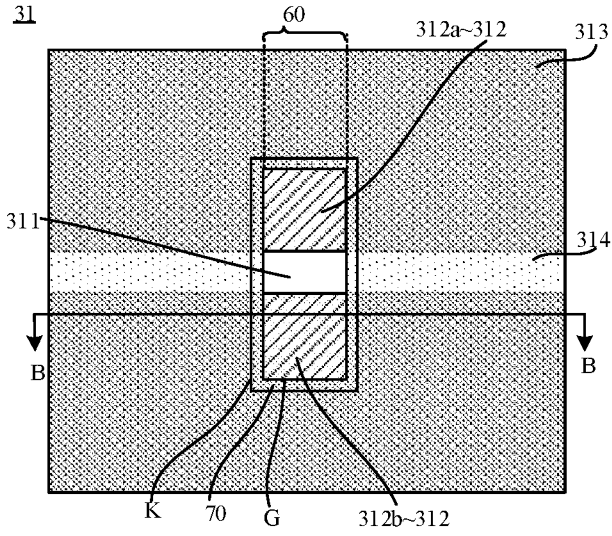
FIG. 9 is a structural diagram of another driving backplane, in accordance with some embodiments of the related art.
Figure 10:
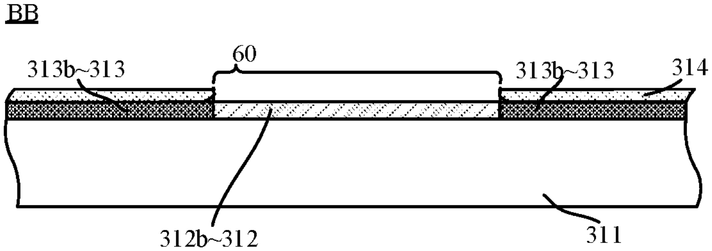
FIG. 10 is a sectional view of the driving backplane in FIG. 9 taken along the line BB, in accordance with some embodiments of the related art.

As shown in FIGS. 9 and 10, the driving backplane 31 further includes a reflective layer 314. The reflective layer 314 is disposed on the substrate 311 and covers the plurality of line groups 313. The reflective layer 314 is provided with a plurality of windows 60 therein, and each window 60 exposes a P-electrode pad 312*a* and an N-electrode pad 312*b* of a pad group 312 and a region between the P-electrode pad 312*a* and the N-electrode pad 312*b*.

For example, the reflective layer 314 may be a white ink layer. White ink has a high reflectivity and can reflect light, which is used for improving an optical effect of the driving backplane 31.

It will be noted that in the existing design, a size of the window 60 in the reflective layer 314 corresponds to a size of the P-electrode pad 312*a* and the N-electrode pad 312*b*, and the window 60 is used to expose the pad group 312. That is, a single window 60 in the reflective layer 314 is used to expose only a P-electrode pad 312*a* and an N-electrode pad 312*b* of a single pad group 312 and a region between the P-electrode pad 312*a* and the N-electrode pad 312*b*.

It will be noted that the term "expose" refers to a state in which no film layer is provided on a side of the reflective layer 314 away from the substrate 311. That is, in a case where the reflective layer 314 is a layer farthest away from the substrate 311, the window 60 in the reflective layer 314 exposes the pad group 312 when the substrate 311 is viewed in a direction perpendicular to a plane where the substrate 311 is located.

Figure 11:
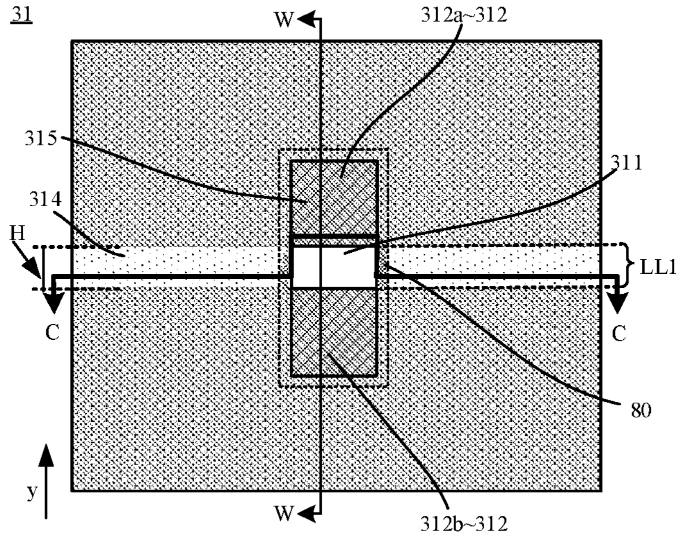
FIG. 11 is a structural diagram of yet another driving backplane, in accordance with some embodiments of the related art.
Figure 12A:
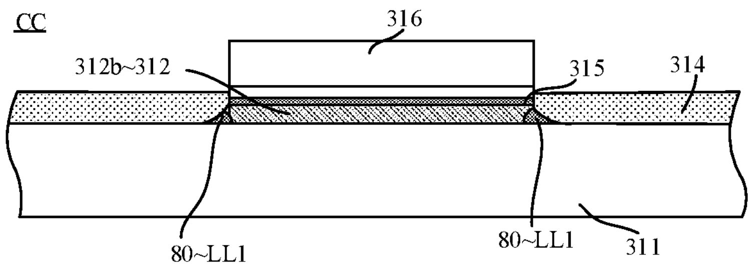
FIG. 12A is a sectional view of the driving backplane in FIG. 11 taken along the line CC, in accordance with some embodiments of the related art.
Figure 12B:
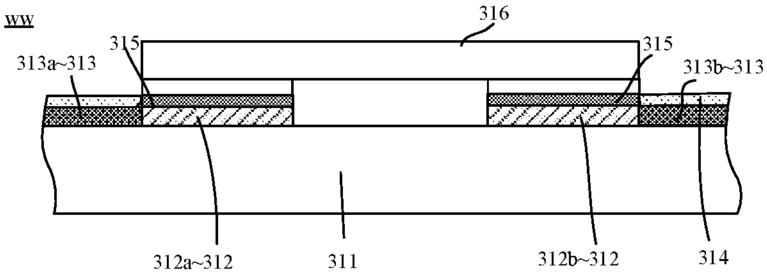
FIG. 12B is a sectional view of the driving backplane in FIG. 11 taken along the line WW, in accordance with some embodiments of the related art.

As shown in FIGS. 11, 12A and 12B, the driving backplane 31 further includes connection solder paste patterns 315 and light-emitting chips 316. Connection solder paste patterns 315 are respectively disposed on a P-electrode pad 312*a* and an N-electrode pad 312*b*, and a single light-emitting chip 316 is connected to a P-electrode pad 312*a* and an N-electrode pad 312*b* of a single pad group 312 by connection solder paste patterns 315. Thus, the light-emitting chips 316 on the substrate 311 are arranged in a regular array.

For example, the light-emitting chips 316 may be blue light LED package chips (e g., blue light mini-LED package chips), and in this case, the driving backplane 31 is the blue light driving backplane. Alternatively, the light-emitting chips 316 may be white light LED package chips (e.g., white light mini-LED package chips), and in this case, the driving backplane 31 is the white light driving backplane.

Figure 13:
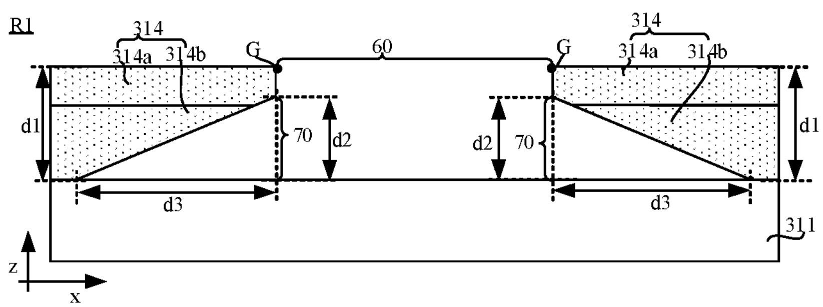
FIG. 13 is a diagram showing a step of forming a reflective layer, in accordance with some embodiments of the present disclosure.

However, the inventors have found that, as shown in FIG. 13, in step R1 of forming the reflective layer 314, the white ink forming the reflective layer 314 is coated on the substrate 311, and the white ink is cured by irradiation of ultraviolet (UV) light; since an upper portion of the white ink is sufficiently irradiated by light, and the upper portion 314*a* of the white ink is sufficiently photopolymerized, and thus the upper portion 314*a* of the white ink is completely cured; however, a lower portion 314*b* of the white ink is insufficiently photopolymerized, which causes the lower portion 314*b* of the white ink to be incompletely cured. After the white ink cured, during the process of etching the white ink to form the windows, portions of the lower portion 314*b* of the white ink that are insufficiently photopolymerized and located at edges of the windows 60 will be removed with etching solution, and gaps 70 are formed after the portions of the lower portion 314*b* of the white ink are removed.

It will be noted that the upper portion 314*a* of the white ink is a portion of the white ink away from the surface of the substrate 311, the lower portion 314*b* of the white ink is a portion of the white ink proximate to the surface of the substrate 311, and the upper portion 314*a* of the white ink is closer to a light source of UV light than the lower portion 314*b* of the white ink.

It will be understood that since a gap 70 of the reflective layer 314 is formed by removing a portion of the lower portion 314*b* of the white ink located at an edge of the window 60 of the reflective layer 314, a shape of an orthogonal projection of a contour of the gap 70 of the reflective layer 314 on the substrate 311 is corresponding to a shape of a contour of an orthogonal projection of the window 60 of the reflective layer 314 on the substrate 311. Referring again to FIG. 9, in a case where the contour of the orthogonal projection of the window 60 of the reflective layer 314 on the substrate 311 has a rectangular shape, the contour of the orthogonal projection of the gap 70 of the reflective layer 314 on the substrate 311 also has a rectangular shape; and a region where the gap 70 of the reflective layer 314 is located is a region between the surface of the substrate 311 and a portion of the reflective layer 314 that is located between a boundary line G of the window 60 of the reflective layer 314 and a dashed box K, and the dashed box K is an outer contour line of the gap 70 away from the boundary line G of the window 60.

During the process of printing solder paste on the P-electrode pads 312*a* and the N-electrode pads 312*b* of the pad groups 312 to form the connection solder paste patterns 315, referring again to FIGS. 11 and 12A, when the solder paste printing is offset or the solder paste printing is repeatedly performed, the solder paste may remain in the gap 70 under the edge of the window 60 in the white ink and cannot be cleaned and removed, and the residual solder paste accumulates to form residual solder paste 80. In a y direction in which the P-electrode pad 312*a* and the N-electrode pad 312*b* of the pad group 312 are spaced apart, when an amount of the residual solder paste 80 is large and the residual solder paste 80 accumulates to form a connection line LL1 connecting the P-electrode pad 312*a* and the N-electrode pad 312*b*, the bridging connection between the P-electrode pad 312*a* and the N-electrode pad 312*b* may cause a short circuit. That is, the residual solder paste 80 under the edge of the window in the white ink forms a connection path of the P-electrode pad 312*a* and the N-electrode pad 312*b*.

Figure 14:
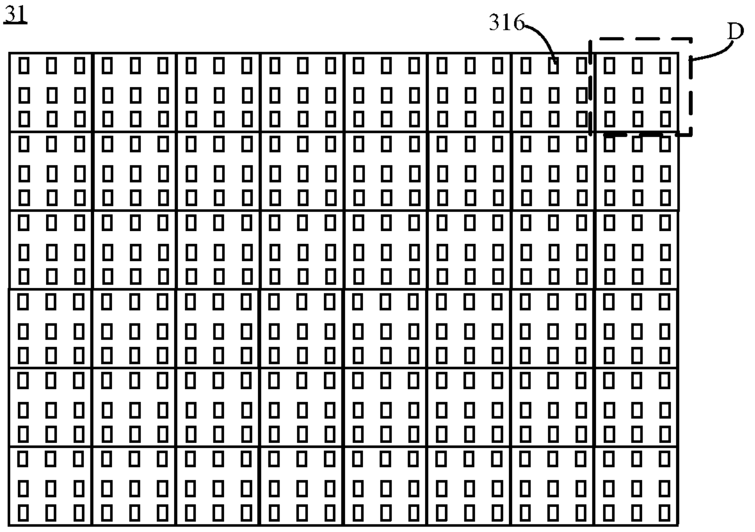
FIG. 14 is a structural diagram of yet another driving backplane, in accordance with some embodiments of the related art.
Figure 15:
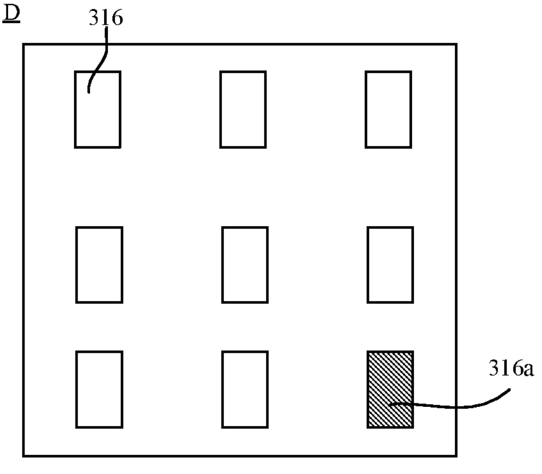
FIG. 15 is an enlarged view of part D of the driving backplane in FIG. 14, in accordance with some embodiments of the related art.

In the driving backplane 31, as shown in FIGS. 14 and 15, a display region is generally divided into a plurality of display zones D, and light-emitting chips 316 in each display zone D are arranged in series; when residual solder paste 80 of a pad group 312 forms a connection path of a P-electrode pad 312*a* and an N-electrode pad 312*b* of the pad group 312, a light-emitting chip 316*a* connected to the P-electrode pad 312*a* and the N-electrode pad 312*b* may be short-circuited, which causes the light-emitting chip 316*a* to be turned off; moreover, the other light-emitting chips 316 connected in series may cause a flare phenomenon due to the increase of the current, which causes the scrapping of the driving backplane 31 and affects product yield.

Therefore, referring again to FIG. 11, in a case where a dimension of the connection line LL1 formed by the residual solder paste 80 in the y direction is equal to a distance H between the P-electrode pad 312*a* and the N-electrode pad 312*b*, the P-electrode pad 312*a* and the N-electrode pad 312*b* are connected to cause a short circuit. Since a size of the light-emitting chip 316 used in the related art is smaller and smaller, the distance H between the P-electrode pad 312*a* and the N-electrode pad 312*b* corresponding to the light-emitting chip 316 is reduced; then the connection line LL1 may be formed through accumulation of a small amount of the residual solder paste 80, which further increases the risk of the short circuit of the P-electrode pad 312*a* and the N-electrode pad 312*b* of the pad group 312 that are connected through solder paste, and more easily causes the scrapping of the driving backplane 31.

The inventors have also found that, referring again to FIG. 13, the closer the gap 70 formed in the reflective layer 314 is to the window 60, the more the white ink will be removed, that is, the closer the formed gap 70 is to the window 60, the larger a dimension of the gap 70 in a z direction will be. The z direction is a direction perpendicular to the plane where the substrate 311 is located. The maximum dimension d2 of the gap 70 in the z direction is located at the boundary line G of the window 60 of the white ink, i.e., at an open portion of the gap 70. In addition, the larger a thickness d1 of the reflective layer 314 in the z direction is, the larger the maximum dimension d2 of the gap 70 in the z direction and a dimension d3 of the gap 70 in an x direction will be. The x direction is perpendicular to the y direction, and the x direction is perpendicular to the direction z. The maximum dimension d2 of the gap 70 in a third direction (the z direction) is ½ to ⅔ of the thickness d1 of the reflective layer 314, and the dimension d3 of the gap 70 in a second direction (the x direction) is 1.1 to 1.2 times the thickness d1 of the reflective layer 314.

Figures 16, 17A:
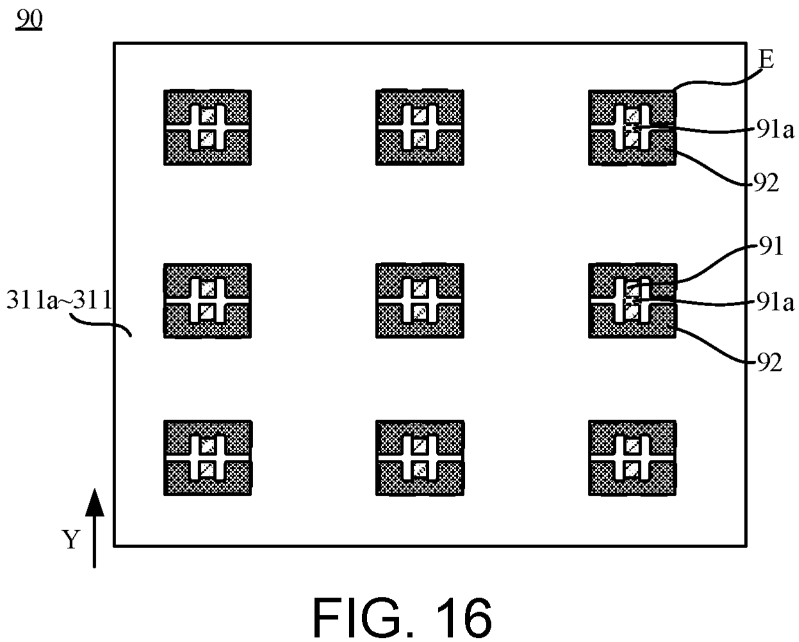
FIG. 16 is a structural diagram of a driving backplane, in accordance with some embodiments of the present disclosure.
FIG. 17A is an enlarged view of part E of the driving backplane in FIG. 16, in accordance with some embodiments of the present disclosure.

In light of these, as shown in FIG. 16, some embodiments of the present disclosure provide a driving backplane 90, and the driving backplane 90 includes a substrate 311, a plurality of pad groups 91 and a plurality of line groups 92. It will be noted that only a structure of the driving backplane 90 in an inner region of a dashed box E is shown in FIG. 16, and a structure of the driving backplane 90 in an outer region of the dashed box E is not limited, and thus the structure of the driving backplane 90 in the outer region of the dashed box E is not shown in FIG. 16. The plurality of pad groups 91 are arranged in an array on a first surface 311*a* of the substrate 311, and each pad group 91 includes two pads spaced apart in a first direction Y. The two pads have a pad spacer region 91*a* therebetween.

The plurality of line groups 92 are disposed on the first surface 311*a* of the substrate 311, and each line group 92 includes two lines, and a line of each line group 92 is connected to a pad of a pad group 91.

The substrate 311 includes an FR4 board (a double-sided copper-clad PCB formed by laminating epoxy resin and glass cloth), a BT (a thermosetting resin formed by using bismaleimide and triazine as main resin components and adding epoxy resin, polyphenylene oxide resin or allyl compound as a modifying component) board, an FPC, or glass, which is not limited here.

In addition, the substrate 311 further includes other film layer (e.g., a buffer layer) disposed between the substrate 311 and the line groups 92 and/or the pad groups 91. The substrate 311 is not limited to the substrate 311 itself, but is a collective term representing the substrate 311 and other film layer disposed between the substrate 311 and the line groups 92.

In some examples, as shown in FIG. 17A, each pad group 91 includes a first pad 911 and a second pad 912 that are spaced apart in the first direction Y, and each line group 92 includes a first line 921 and a second line 922. A first pad 911 of a single pad group 91 is connected to a first line 921 of a single line group 92, and a second pad 912 of the single pad group 91 is connected to a second line 922 of the single line group 92.

For example, the first pad 911 is one of a P-electrode pad and an N-electrode pad, and the second pad 912 is the other of the P-electrode pad and the N-electrode pad, which is not limited here.

Figure 17B:
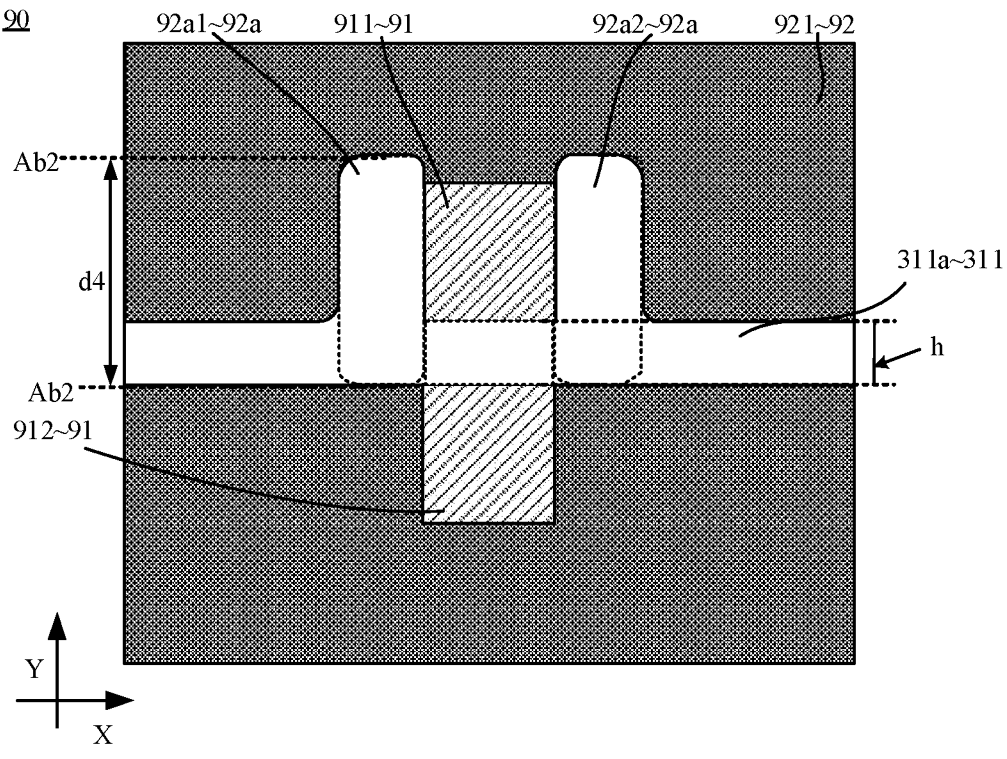
FIG. 17B is a structural diagram of another driving backplane, in accordance with some embodiments of the present disclosure.

As shown in FIGS. 17A and 17B, at least one pad of the pad group 91 and a line connected thereto define line hollowed-out regions 92*a*. For example, as shown in FIG. 17B, the first pad 911 and the first line 921 in the line group 92 connected thereto define the line hollowed-out regions 92*a*. The line hollowed-out regions 92*a* include a first line hollowed-out region 92*a*1 and a second line hollowed-out region 92*a*2. The first line hollowed-out region 92*a*1 and the second line hollowed-out region 92*a*2 are disposed on two sides of the pad(s) (e.g., the first pad 911) in a second direction X, respectively. Dimensions d4 of the first line hollowed-out region 92*a*1 and the second line hollowed-out region 92*a*2 in the first direction Y are each greater than a dimension h of the pad spacer region 91*a* corresponding to the pad group 91 in the first direction Y. The second direction X is perpendicular to the first direction Y, and the second direction X and the first direction Y are parallel to the first surface 311*a* of the substrate 311.

In some examples, as shown in FIG. 17B, the first line hollowed-out region 92*a*1 is located on a left side of the first pad 911 in the second direction X, and the second line hollowed-out region 92*a*2 is located on a right side of the first pad 911 in the second direction X. The first line hollowed-out region 92*a*1 and the second line hollowed-out region 92*a*2 are not provided on two sides of the second pad 912 in the second direction X.

It will be understood that a hollowed-out region refers to a region where a portion of an entire material layer is hollowed out. The line hollowed-out region 92*a* refers to a line hollowed-out region formed at a position where a portion of a line material layer is hollowed out, that is, no line material is provided in this region.

In some embodiments, as shown in FIG. 17A, the two pads in the pad group 91 and the line group 92 connected thereto define the line hollowed-out regions 92*a*, and the first line hollowed-out region 92*a*1 and the second line hollowed-out region 92*a*2 are disposed on two sides of the pad group 91 in the second direction X, respectively.

In some examples, as shown in FIG. 17A, the first line hollowed-out region 92*a*1 is located on a left side of the pad group 91 in the second direction X, and the second line hollowed-out region 92*a*2 is located on a right side of the pad group 91 in the second direction X. That is, two sides of both the first pad 911 and the second pad 912 in the second direction X are each provided with a line hollowed-out region 92*a*. An end of the first pad 911 away from the pad spacer region 91*a* is connected to the first line 921, and an end of the second pad 912 away from the pad spacer region 91*a* is connected to the second line 922. Compared to the related art, in the embodiments of the present disclosure, the hollowed-out regions are provided on the two sides of the pad group 91 in the second direction X, and no line exists in the hollowed-out regions.

It will be noted that the connection manner between the first pad 911 and the first line 921 and the connection manner between the second pad 912 and the second line 922 are different according to the arrangement of the hollowed-out regions, which is not limited here.

Figure 18:
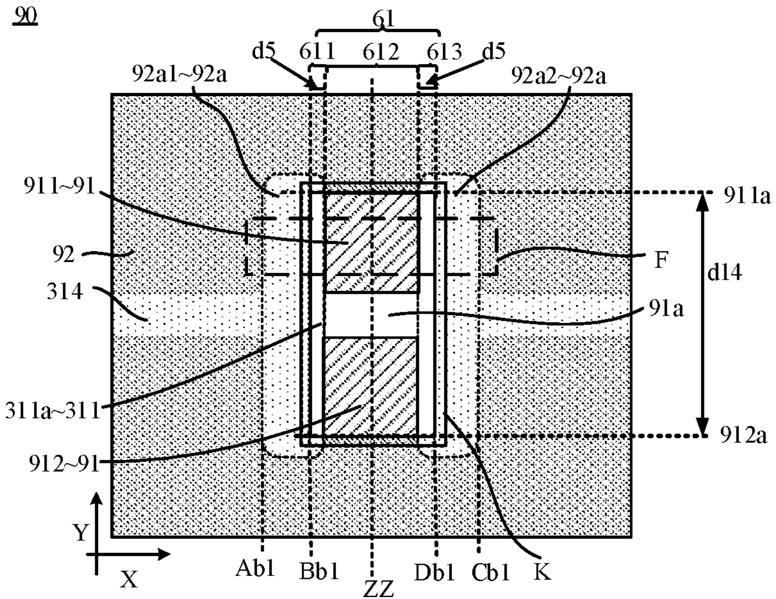
FIG. 18 is a structural diagram of yet another driving backplane, in accordance with some embodiments of the present disclosure.

In some embodiments, as shown in FIG. 18, the driving backplane 90 further includes a reflective layer 314, and the reflective layer 314 covers the first surface 311*a* of the substrate 311 and the plurality of line groups 92; the reflective layer 314 is provided with a plurality of window regions 61 therein, and each window region 61 includes a first region 611, a second region 612 and a third region 613 arranged in the second direction X. The second region 612 exposes one pad group 91 and a pad spacer region 91*a* corresponding to the one pad group 91. The first region 611 and the third region 613 expose portions of the first surface 311*a* of the substrate 311. In the second direction X, a boundary Ab1 of an orthogonal projection of the first line hollowed-out region 92*a*1 on the substrate 311 away from the pad group 91 is farther away from the pad group 91 than a boundary Bb1 of an orthogonal projection of the first region 611 on the substrate 311 away from the pad group 91. In the second direction X, a boundary Cb1 of an orthogonal projection of the second line hollowed-out region 92*a*2 on the substrate 311 away from the pad group 91 is farther away from the pad group 91 than a boundary Db1 of an orthogonal projection of the third region 613 on the substrate 311 away from the pad group 91.

The explanation of the term "expose" is as described above, and will not be repeated here. In addition, in a case where other film layer is provided between the substrate 311 and the line group 92, the description "exposing the first surface 311*a* of the substrate 311" refers to exposing a surface of a film layer between the substrate 311 and the line groups 92, and this film layer is a film layer proximate to the line groups 92.

In some examples, referring again to FIG. 18, the reflective layer 314 may be a white ink layer. White ink has a high reflectivity and can reflect light, and is used for improving an optical effect of the driving backplane 90. The first region 611, the second region 612 and the third region 613 of the reflective layer 314 are sequentially arranged and connected in the second direction X, and the second region 612 exposes a pad group 91 and a pad spacer region 91*a* corresponding to the pad group 91. Therefore, the second region 612 has the same function as the window 60.

Figure 19:
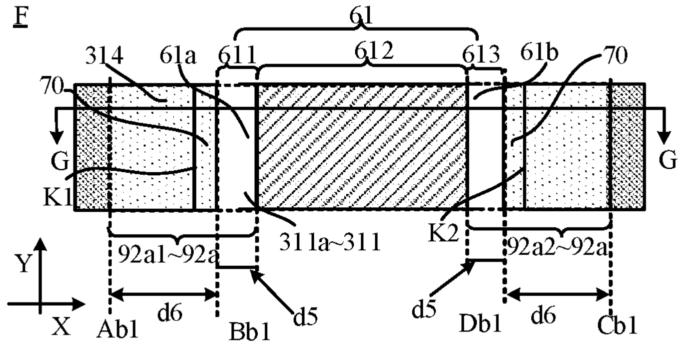
FIG. 19 is an enlarged view of part F of the driving backplane in FIG. 18, in accordance with some embodiments of the present disclosure.
Figure 20:
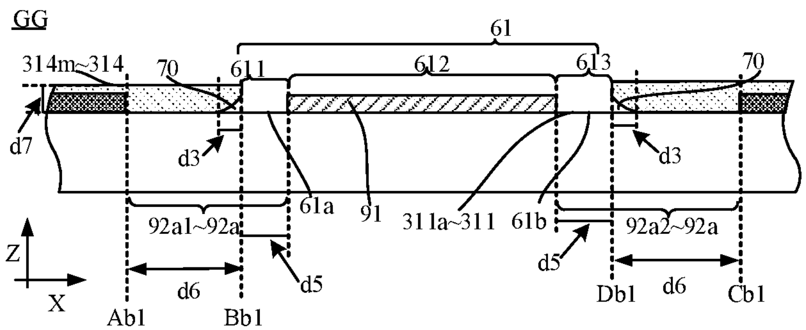
FIG. 20 is a sectional view of the driving backplane in FIG. 19 taken along the line GG, in accordance with some embodiments of the present disclosure.

In some examples, as shown in FIGS. 19 and 20, the first region 611 exposes a portion 61*a* of the first surface 311*a* of the substrate 311 exposed by the first line hollowed-out region 92*a*1, and the boundary Bb1 of the orthogonal projection of the first region 611 on the substrate 311 away from the pad group 91 and the boundary Ab1 of the orthogonal projection of the first line hollowed-out region 92*a*1 on the substrate 311 away from the pad group 91 have a distance d6 therebetween in the second direction X. The third region 613 exposes a portion 61*b* of the first surface 311*a* of the substrate 311 exposed by the second line hollowed-out region 92*a*2, and the boundary Db1 of the orthogonal projection of the third region 613 on the substrate 311 away from the pad group 91 and the boundary Cb1 of the orthogonal projection of the second line hollowed-out region 92*a*2 on the substrate 311 away from the pad group 91 have a distance d6 therebetween in the second direction X.

It will be noted that the distance d6 between the boundary Bb1 of the orthogonal projection of the first region 611 on the substrate 311 away from the pad group 91 and the boundary Ab1 of the orthogonal projection of the first line hollowed-out region 92*a*1 on the substrate 311 away from the pad group 91 may be the same as or different from the distance d6 between the boundary Db1 of the orthogonal projection of the third region 613 on the substrate 311 away from the pad group 91 and the boundary Cb1 of the orthogonal projection of the second line hollowed-out region 92*a*2 on the substrate 311 away from the pad group 91, which is not limited here.

In some examples, referring again to FIG. 19, there is a distance d5 in the second direction X between the pad group 91 and a gap 70 formed in the reflective layer 314 proximate to an edge of the window region 61. The gap 70 includes: a region between the first surface 311*a* of the substrate 311 and a portion of the reflective layer 314, the portion of the reflective layer 314 being located between a dashed line K1 (a portion of a dashed box K) and the boundary Bb1; and a region between the first surface 311*a* of the substrate 311 and another portion of the reflective layer 314, the another portion of the reflective layer 314 being located between a dashed line K2 (another portion of the dashed box K) and the boundary Db1. The dashed box K is a contour line of the gap 70 away from the second region 612. A principle of formation of the gap 70 is as described above, and details will not be repeated here.

In some examples, referring again to FIG. 20, the distance d5 in the second direction X between the pad group 91 and the gap 70 on the left side of the pad group 91 is equal to a dimension of the first region 611 in the second direction X; the distance d5 in the second direction X between the pad group 91 and the gap 70 on the right side of the pad group 91 is equal to a dimension of the third region 613 in the second direction X; and the dimension of the first region 611 in the second direction X may be the same as or different from the dimension of the third region 613 in the second direction X, which is not limited here. Therefore, the distance d5 in the second direction X between the pad group 91 and the gap 70 on the left side of the pad group 91 may be the same as or different from the distance d5 in the second direction X between the pad group 91 and the gap 70 on the right side of the pad group 91, which is not limited here.

Figure 21:
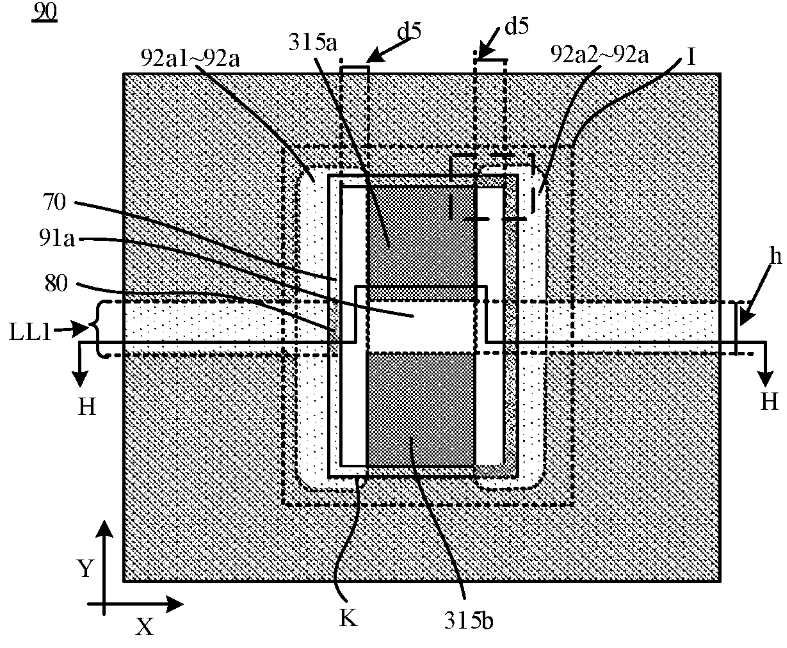
FIG. 21 is a structural diagram of yet another driving backplane, in accordance with some embodiments of the present disclosure.

In some embodiments, as shown in FIG. 21, the driving backplane 90 further includes a plurality of first connection solder paste patterns 315*a* and a plurality of second connection solder paste patterns 315*b*; and each first connection solder paste pattern 315*a* covers a single first pad 911, and each second connection solder paste pattern 315*b* covers a single second pad 912.

In some examples, referring again to FIG. 21, the first pad 911 is covered with the first connection solder paste pattern 315*a* and the second pad 912 is covered with the second connection solder paste pattern 315*b*. Since the first pad 911 is covered with the first connection solder paste pattern 315*a*, and the second pad 912 is covered with the second connection solder paste pattern 315*b*, the first pad 911 and the second pad 912 are not shown in the figures. It will be understood that a position marked as the first connection solder paste pattern 315*a* can be understood as a position where the first pad 911 is located, and a position marked as the second connection solder paste pattern 315*b* can be understood as a position where the second pad 912 is located.

It will be noted that the solder paste can protect the pad and is used for the connection of subsequent electrical component(s). In solder paste printing step, when the solder paste printing is offset, the solder paste may be cleaned by using an ultrasonic cleaning method, and the solder paste on a surface of the pad and the first surface 311*a* of the substrate 311 can be removed through the cleaning step, and then the solder paste printing is performed again. However, in the cleaning step of the solder paste, solder paste in the gap 70 is not easily cleaned, and especially when the solder paste printing step is repeated multiple times, a large amount of solder paste remains in the gap 70. In the related art, as shown in FIG. 11, in a case where a dimension, in the y direction, of the connection line LL1 formed by the solder paste in the gap 70 is equal to the distance H between the P-electrode pad 312*a* and the N-electrode pad 312*b* in the direction y, the P-electrode pad 312*a* and the N-electrode pad 312*b* are connected through the solder paste to cause a short circuit, and details are as described above and will not be repeated here.

Figure 22:
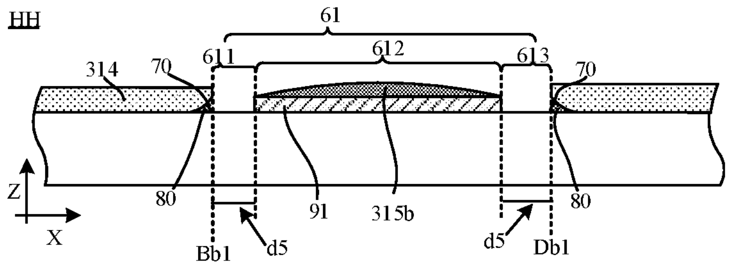
FIG. 22 is a sectional view of the driving backplane in FIG. 21 taken along the line HH, in accordance with some embodiments of the present disclosure.

In the embodiments of the present disclosure, each of the two sides of the pad group 91 in the second direction X and the respective line group 92 connected thereto have the line hollowed-out region 92*a* therebetween, and the first region 611 and the third region 613 are disposed on the two sides of the second region 612 in the second direction X. As shown in FIGS. 20 and 22, the pad group 91 and the gap 70 that is formed in the reflective layer 314 proximate to the edge of the window region 61 have the distance d5 in the second direction X therebetween. In this way, even if a large amount of solder paste remains in the gap 70, the residual solder paste does not contact the pad group 91 due to the distance d5 between the gap 70 and the pad group 91. As a result, the short circuit caused by the connection of the first pad 911 and the second pad 912 is not easy to occur. For example, referring again to FIG. 21, in a case where a dimension, in the first direction Y, of a connection line LL1 formed by residual solder paste 80 accumulated in the gap 70 on the left side of the pad spacer region 91*a* in the second direction X is equal to a dimension h, in the first direction Y, of the pad spacer region 91*a* corresponding to the pad group 91, the short circuit caused by the connection of the first pad 911 and the second pad 912 will not occur, thus reducing the risk of the short circuit of the pads that are connected through the solder paste and increasing the product yield.

In some implementations, referring again to FIG. 20, the distance d6 in the second direction X between the boundary Ab1 of the orthogonal projection of the first line hollowed-out region 92*a*1 on the substrate 311 away from the pad group 91 and the boundary Bb1 of the orthogonal projection of the first region 611 on the substrate 311 away from the pad group 91 is greater than 1.2 times a distance d7 in a third direction Z between a surface 314*m* of the reflective layer 314 away from the substrate 311 and the first surface 311*a* of the substrate 311. That is, d6 is greater than a product of 1.2 and d7 ($d6>1.2\times d7$). The distance d6 in the second direction X between the boundary Cb1 of the orthogonal projection of the second line hollowed-out region 92*a*2 on the substrate 311 away from the pad group 91 and the boundary Db1 of the orthogonal projection of the third region 613 on the substrate 311 away from the pad group 91 is greater than 1.2 times the distance d7 in the third direction Z between the surface 314*m* of the reflective layer 314 away from the substrate 311 and the first surface 311*a* of the substrate 311. That is, d6 is greater than a product of 1.2 and d7 (d6>1.2×d7). The third direction Z is perpendicular to the plane where the substrate 311 is located.

In some examples, referring again to FIG. 20, the distance d6 in the second direction X between the boundary Ab1 of the orthogonal projection of the first line hollowed-out region 92*a*1 on the substrate 311 away from the pad group 91 and the boundary Bb1 of the orthogonal projection of the first region 611 on the substrate 311 away from the pad group 91 is 1.3 times, 1.5 times, 2 times, or 2.5 times the distance d7 in the third direction Z between the surface 314*m* of the reflective layer 314 away from the substrate 311 and the first surface 311*a* of the substrate 311, that is, d6=1.3×d7, d6=1.5×d7, d6=2×d7, or d6=2.5×d7, which is not limited here. The distance d6 in the second direction X between the boundary Cb1 of the orthogonal projection of the second line hollowed-out region 92*a*2 on the substrate 311 away from the pad group 91 and the boundary Db1 of the orthogonal projection of the third region 613 on the substrate 311 away from the pad group 91 is 1.4 times, 1.6 times, 1.8 times, or 2.3 times the distance d7 in the third direction Z between the surface 314*m* of the reflective layer 314 away from the substrate 311 and the first surface 311*a* of the substrate 311, that is, d6=1.4×d7, d6=1.6×d7, d6=1.8×d7, or d6=2.3×d7, which is not limited here.

As can be seen from the above analysis of the principle of the formation of the gap 70 in the reflective layer 314, as shown in FIG. 13, the dimension d3 of the gap 70 in the x direction is 1.1 to 1.2 times the thickness d1 of the reflective layer 314, and details are as described above and will not be repeated here. The dimension d3 of the gap 70 in the x direction is equal to a dimension d3 of the gap 70 in the second direction X here, and the thickness d1 of the reflective layer 314 is equal to the distance d7 in the third direction Z between the surface 314*m* of the reflective layer 314 away from the substrate 311 and the first surface 311a of the substrate 311. Referring again to FIG. 20, by setting d6>1.2×d7, it may be ensured that d6 is greater than d3 (d6>d3). That is, the residual solder paste in the gap 70 is not connected to the line in the line group 92 in the second direction X to cause a short circuit.

Figure 23:
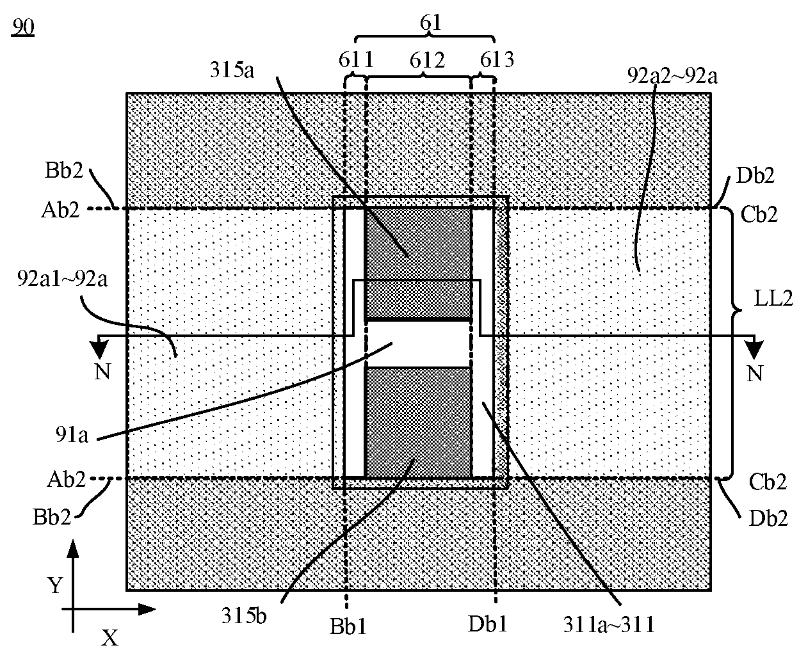
FIG. 23 is a structural diagram of yet another driving backplane, in accordance with some embodiments of the present disclosure.

In some examples, as shown in FIG. 23, no line is provided in a region between the pad spacer region 91*a* and two second boundaries Ab2 of the first line hollowed-out region 92*a*1 away from the pad spacer region 91*a*. That is, in a region on the left side of the first pad 911 in the second direction X, no line is provided in a region between the pad spacer region 91*a* and a second boundary Ab2, the second boundary Ab2 being located on the same side of the pad spacer region 91*a* as the first pad 911; in a region on the left side of the second pad 912 in the second direction X, no line is provided in a region between the pad spacer region 91*a* and another second boundary Ab2, the another second boundary Ab2 being located on the same side of the pad spacer region 91*a* as the second pad 912. Similarly, no line is provided in a region between the pad spacer region 91*a* and two fourth boundaries Cb2 of the second line hollowed-out region 92*a*2 away from the pad spacer region 91*a*. That is, in a region on the right side of the first pad 911 in the second direction X, no line is provided in a region between the pad spacer region 91*a* and a fourth boundary Cb2, the fourth boundary Cb2 being located on the same side of the pad spacer region 91*a* as the first pad 911; in a region on the right side of the second pad 912 in the second direction X, no line is provided in a region between the pad spacer region 91*a* and another fourth boundary Cb2, the another fourth boundary Cb2 being located on the same side of the pad spacer region 91*a* as the second pad 912. In this way, it may maximize the dimensions of the first line hollowed-out region 92*a*1 and the second line hollowed-out region 92*a*2 in the second direction X, and may ensure that the residual solder paste in the gap 70 is not connected to the lines of the line group 92 in the second direction X to cause a short circuit.

It will be noted that, as shown in FIG. 23, the first pad 911 and the second pad 912 are not shown; and it will be understood that a position marked as the first connection solder paste pattern 315*a* can be understood as a position where the first pad 911 is located, and a position marked as the second connection solder paste pattern 315*b* can be understood as a position where the second pad 912 is located.

In some embodiments, referring again to FIG. 19, a dimension d5 of the first region 611 in the second direction X is in a range from 0.05 mm to 0.1 mm, and a dimension d5 of the third region 613 in the second direction X is in a range from 0.05 mm to 0.1 mm. That is, d5 is greater than or equal to 0.05 mm and less than or equal to 0.1 mm (0.1 mm≥d5≥0.05 mm).

For example, the dimension d5 of the first region 611 in the second direction X is 0.05 mm, 0.08 mm, or 0.09 mm, which is not limited here; and the dimension d5 of the third region 613 in the second direction X is 0.06 mm, 0.07 mm, or 0.1 mm, which is not limited here.

Since the dimensions d5 of the first region 611 and the third region 613 in the second direction X are each greater than or equal to 0.05 mm, the distance d5 in the second direction X between the gap 70 and the pad group 91 may be ensured, which reduces the risk of the short circuit due to the connection in the second direction X between the pads and solder paste, the solder paste being accumulated in a portion of the gap 70 extending in the first direction Y. Since the dimensions d5 of the first region 611 and the third region 613 in the second direction X are each less than or equal to 0.1 mm, it may effectively ensure that an area of the reflective layer 314 is large enough, and in turn ensure that the reflective layer 314 has a good light reflection effect. As a result, the lighting-emitting effect of the driving backplane 90 may not be affected.

Figure 24:
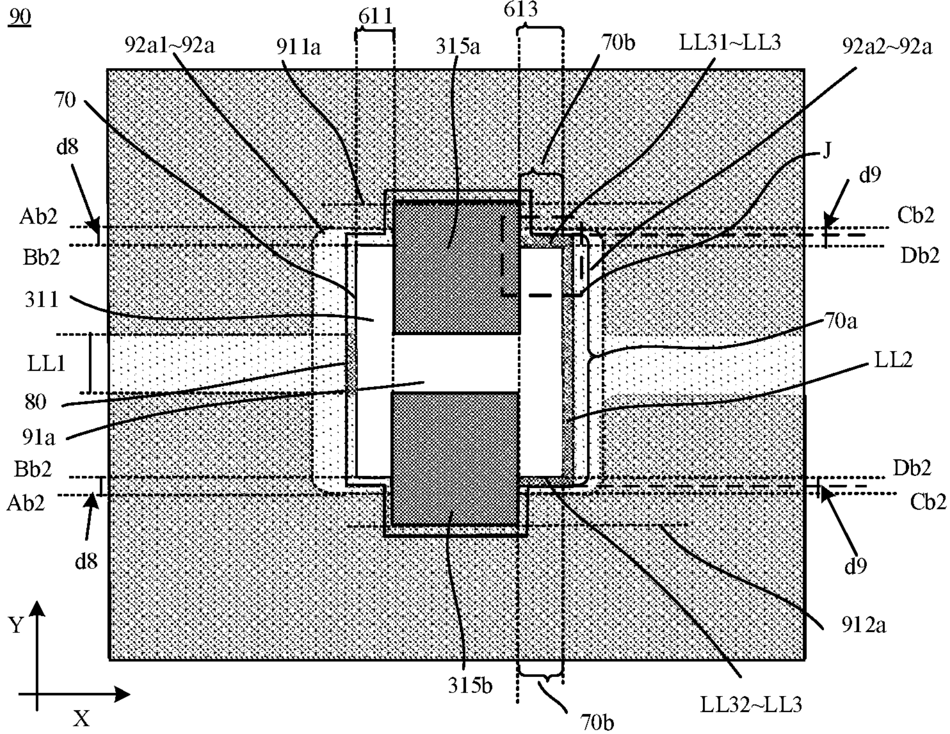
FIG. 24 is a structural diagram of yet another driving backplane, in accordance with some embodiments of the present disclosure.
Figure 25:
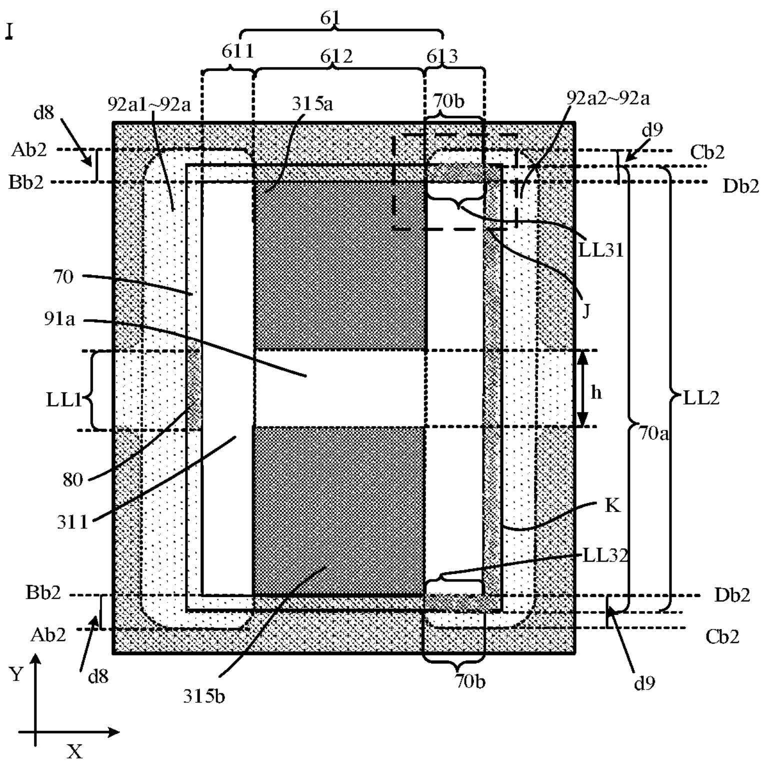
FIG. 25 is an enlarged view of part I of the driving backplane in FIG. 21, in accordance with some embodiments of the present disclosure.

In some embodiments, as shown in FIGS. 24 and 25, the two opposite second boundaries Ab2 of the first line hollowed-out region 92*a*1 in the first direction Y are farther away from the pad spacer region 91*a* than two opposite first boundaries Bb2 of an orthogonal projection of the first region 611 on the substrate 311 in the first direction Y. The two opposite fourth boundaries Cb2 of the second line hollowed-out region 92*a*2 in the first direction Y are farther away from the pad spacer region 91*a* than two opposite third boundaries Db2 of an orthogonal projection of the third region 613 on the substrate 311 in the first direction Y.

In some examples, referring again to FIG. 24, the two fourth boundaries Cb2 of the second line hollowed-out region 92*a*2 are farther away from the pad spacer region 91*a* than the two third boundaries Db2. Therefore, continuous residual solder paste 80 is accumulated in a portion 70*a* of the gap 70 extending in the first direction Y to form a connection line LL2; continuous residual solder paste 80 is accumulated in portions 70*b* of the gap 70 extending in the second direction X to form connection lines LL3, and the portions 70*b* of the gap 70 at the two opposite third boundaries Db2 of the third region 613 in the first direction Y are each formed with a connection line LL3; that is, the residual solder paste 80 forms the connection line LL2, a connection line LL31 and a connection line LL32; only in this case can a tin-connection short circuit of the driving backplane 90 be caused.

Figure 26:
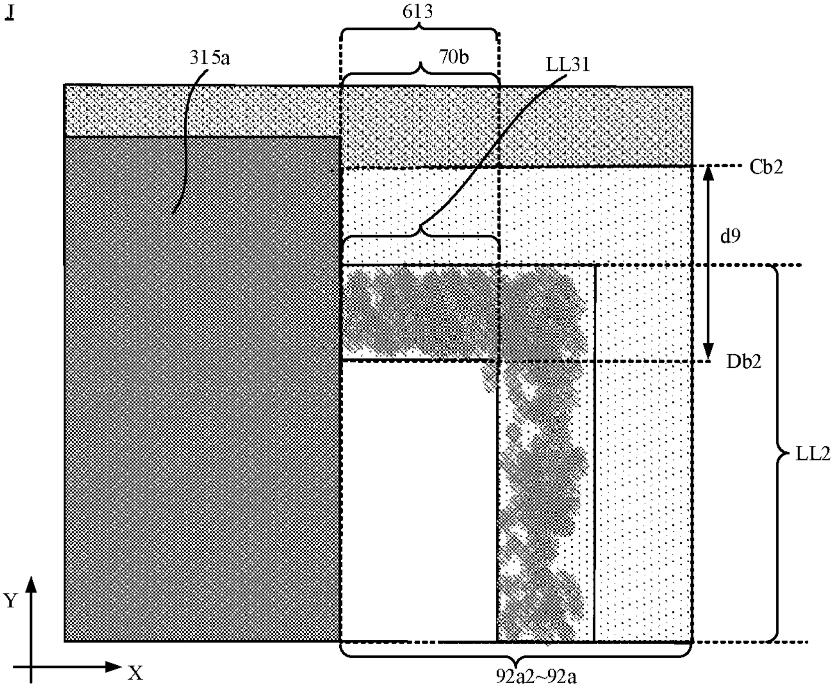
FIG. 26 is an enlarged view of part J of the driving backplane in FIG. 24, in accordance with some embodiments of the present disclosure.

That is, an end of the connection line LL31 in the second direction X is connected to the first pad 911 covered with the first connection solder paste pattern 315*a*, and another end of the connection line LL31 in the second direction X is connected to an end of the connection line LL2, which is shown in the enlarged view of FIG. 26; an end of the connection line LL32 in the second direction X is connected to the second pad 912 covered with the second connection solder paste pattern 315*b*, and another end of the connection line LL32 in the second direction X is connected to another end of the connection line LL2; therefore, the connection path of the first pad 911 and the second pad 912 is formed, and the pads are connected through solder paste may cause the short circuit of the driving backplane 90. A length of the connection path of first pad 911 and the second pad 912 is equal to a total length of the connection lines LL2, LL31 and LL32, and the total length of the connection lines LL2, LL31 and LL32 is much greater than a length of the connection line LL1, and thus a large amount of residual solder paste 80 is required. Therefore, in the embodiments of the present disclosure, it may effectively reduce the risk of the short circuit of the pads that are connected through the solder paste in the driving backplane 90.

It will be noted that, as shown in FIGS. 24 to 26, the first pad 911 and the second pad 912 are not shown; and it will be understood that a position marked as the first connection solder paste pattern 315*a* can be understood as a position where the first pad 911 is located, and a position marked as the second connection solder paste pattern 315*b* can be understood as a position where the second pad 912 is located.

It will be understood that FIGS. 24 to 26 show schematic diagrams of the connection lines LL2, LL31, and LL32 formed by the residual solder paste in the gap 70 in the third region 613, and the connection lines LL2, LL31 and LL32 may also be formed by residual solder paste in the gap 70 in the first region 611, which results in the short circuit of the pads connected through the solder paste in the driving backplane 90, and details will not be repeated here.

In some embodiments, referring again to FIGS. 24 and 25, in the two opposite first boundaries Bb2 of the orthogonal projection of the first region 611 on the substrate 311 in the first direction Y and the two opposite second boundaries Ab2 of the first line hollowed-out region 92*a*1 in the first direction Y, a distance d8 in the first direction Y between the first boundary Bb2 and the second boundary Ab2 on the same side of the pad spacer region 91*a* is greater than 1.2 times the distance d7 in the third direction Z between the surface 314*m* of the reflective layer 314 away from the substrate 311 and the first surface 311*a* of the substrate 311. That is, d8 is greater than a product of 1.2 and d7 (d8>1.2×d7). In the two opposite third boundaries Db2 of the orthogonal projection of the third region 613 on the substrate 311 in the first direction Y and the two opposite fourth boundaries Cb2 of the second line hollowed-out region 92*a*2 in the first direction Y, a distance d9 in the first direction Y between the third boundary Db2 and the fourth boundary Cb2 on the same side of the pad spacer region 91*a* is greater than 1.2 times the distance d7 in the third direction Z between the surface 314*m* of the reflective layer 314 away from the substrate 311 and the first surface 311*a* of the substrate 311. That is, d9 is greater than a product of 1.2 and d7 (d9>1.2×d7). It will be noted that the distance d7 in the third direction Z between the surface 314*m* of the reflective layer 314 away from the substrate 311 and the first surface 311*a* of the substrate 311 is not shown in FIGS. 24 and 25, which is shown in detail in FIG. 20.

For example, referring again to FIG. 24, in the two opposite first boundaries Bb2 of the orthogonal projection of the first region 611 on the substrate 311 in the first direction Y and the two opposite second boundaries Ab2 of the first line hollowed-out region 92*a*1 in the first direction Y, the distance d8 in the first direction Y between the first boundary Bb2 and the second boundary Ab2 on the same side of the pad spacer region 91*a* in the first direction Y is equal to 1.3 times or 1.5 times the distance d7 in the third direction Z between the surface 314*m* of the reflective layer 314 away from the substrate 311 and the first surface 311*a* of the substrate 311, which is not limited here. In the two opposite third boundaries Db2 of the orthogonal projection of the third region 613 on the substrate 311 in the first direction Y and the two opposite fourth boundaries Cb2 of the second line hollowed-out region 92*a*2 in the first direction Y, the distance d9 in the first direction Y between the third boundary Db2 and the fourth boundary Cb2 on the same side of the pad spacer region 91*a* in the first direction Y is equal to 1.3 times or 1.4 times the distance d7 in the third direction Z between the surface 314*m* of the reflective layer 314 away from the substrate 311 and the first surface 311*a* of the substrate 311, which is not limited here. The setting of d8>1.2×d7 and d9>1.2×d7 has the same principle as the setting of the distance d6, and details are as described above and will not be repeated here. In this way, it is possible to avoid that the residual solder paste in the portions 70*b* of the gap 70 extending in the second direction X and the lines of the line group 92 are connected in the first direction Y, increase the length of the connection lines formed by the residual solder paste required for the short circuit of the pads connected through the solder paste in the driving backplane 90, and reduce the risk of the short circuit of the pads connected through the solder paste in the driving backplane 90.

It will be noted that a distance d8 between a first boundary Bb2 and a second boundary Ab2 on a side of the pad spacer region 91*a* in the first direction Y may be the same as or different from a distance d8 between a first boundary Bb2 and a second boundary Ab2 on another side of the pad spacer region 91*a* in the first direction Y, which is not limited here. A distance d9 between a third boundary Db2 and a fourth boundary Cb2 on a side of the pad spacer region 91*a* in the first direction Y may be the same as or different from a distance d9 between a third boundary Db2 and a fourth boundary Cb2 on another side of the pad spacer region 91*a* in the first direction Y, which is not limited here. Moreover, the distance d8 between the first boundary Bb2 and the second boundary Ab2 may be the same as or different from the distance d9 between the third boundary Db2 and the fourth boundary Cb2, which is not limited here.

Alternatively, in some examples, referring again to FIG. 23, the two opposite first boundaries Bb2 of the orthogonal projection of the first region 611 on the substrate 311 in the first direction Y are overlapped with orthogonal projections of the two opposite second boundaries Ab2 of the first line hollowed-out region 92*a*1 in the first direction Y on the substrate 311, respectively. The two opposite third boundaries Db2 of the orthogonal projection of the third region 613 on the substrate 311 in the first direction Y are overlapped with orthogonal projections of the two opposite fourth boundaries Cb2 of the second line hollowed-out region 92*a*2 in the first direction Y on the substrate 311, respectively. In this case, if a connection line LL2 of the connection path is formed, an end, in the first direction Y, of the connection line LL2 formed by the accumulated residual solder paste 80 is connected to the first line 921, and another end, in the first direction Y, of the connection line LL2 is connected to the second line 922. In this case, the connection line LL2 is connected to the first pad 911 and the second pad 912. As a result, the short circuit of the pads connected through the solder paste in the driving backplane 90 may still occur. Here, a length of the connection path (i.e., the connection line LL2) is still greater than the length of the connection line LL1, and the risk of the short circuit of the pads connected through the solder paste in the driving backplane 90 is reduced.

The two opposite second boundaries Ab2 of the first line hollowed-out region 92*a*1 in the first direction Y may be farther away from the pad spacer region 91*a* than the two opposite first boundaries Bb2 of the orthogonal projection of the first region 611 on the substrate 311 in the first direction Y, or a distance between the two opposite second boundaries Ab2 of the first line hollowed-out region 92*a*1 in the first direction Y may be equal to a dimension of the pad spacer region 91*a* in the first direction Y. The two opposite fourth boundaries Cb2 of the second line hollowed-out region 92*a*2 in the first direction Y may be farther away from the pad spacer region 91*a* than the two opposite third boundaries Db2 of the orthogonal projection of the third region 613 on the substrate 311 in the first direction Y, or a distance between the two opposite fourth boundaries Cb2 of the second line hollowed-out region 92*a*2 in the first direction Y may be equal to the dimension of the pad spacer region 91*a* in the first direction Y. Each of the above cases may reduce the risk of the short circuit of the pads connected through the solder paste in the driving backplane 90.

In some embodiments, referring again to FIG. 17A, the two pads of each pad group 91 are the first pad 911 and the second pad 912; in the two opposite second boundaries Ab2 of the first line hollowed-out region 92*a*1 in the first direction Y, the second boundary Ab2 located on the same side of the pad spacer region 91*a* as the first pad 911 is farther away from the pad spacer region 91*a* than an edge 911*a* of the first pad 911 away from the pad spacer region 91*a*; and the second boundary Ab2 located on the same side of the pad spacer region 91*a* as the second pad 912 is farther away from the pad spacer region 91*a* than an edge 912*a* of the second pad 912 away from the pad spacer region 91*a*. The fourth boundary Cb2 located on the same side of the pad spacer region 91*a* as the first pad 911 is farther away from the pad spacer region 91*a* than the edge 911*a* of the first pad 911 away from the pad spacer region 91*a*; and the fourth boundary Cb2 located on the same side of the pad spacer region 91*a* as the second pad 912 is farther away from the pad spacer region 91*a* than the edge 912*a* of the second pad 912 away from the pad spacer region 91*a*.

In some examples, referring again to FIG. 17A, in the two opposite second boundaries Ab2 of the first line hollowed-out region 92*a*1 in the first direction Y, the second boundary Ab2 located on the same side of the pad spacer region 91*a* as the first pad 911 is farther away from the pad spacer region 91*a* than the edge 911*a* of the first pad 911, and the second boundary Ab2 located on the same side of the pad spacer region 91*a* as the second pad 912 is farther away from the pad spacer region 91*a* than the edge 912*a* of the second pad 912. The fourth boundary Cb2 located on the same side of the pad spacer region 91*a* as the first pad 911 is farther away from the pad spacer region 91*a* than the edge 911*a* of the first pad 911; and the fourth boundary Cb2 located on the same side of the pad spacer region 91*a* as the second pad 912 is farther away from the pad spacer region 91*a* than the edge 912*a* of the second pad 912. That is, a dimension d4 of the first line hollowed-out region 92*a*1 in the first direction Y is greater than a distance d14 between the edge 911*a* of the first pad 911 and the edge 912*a* of the second pad 912 in the first direction Y; and a dimension d4 of the second line hollowed-out region 92*a*2 in the first direction Y is greater than the distance d14 between the edge 911*a* of the first pad 911 and the edge 912*a* of the second pad 912 in the first direction Y.

A structure of the driving backplane 90 shown in FIG. 17A after being provided with the reflective layer 314 is as shown in FIG. 25. In the two opposite second boundaries Ab2 of the first line hollowed-out region 92*a*1 in the first direction Y, the second boundary Ab2 located on the same side of the pad spacer region 91*a* as the first pad 911 is farther away from the pad spacer region 91*a* than the edge 911*a* of the first pad 911. In this way, it may be convenient for increasing the length of the portion 70*a* of the gap 70 of the reflective layer 314 extending in the first direction Y. As a result, as long as the connection line LL2 formed by the residual solder paste 80 accumulated in the portion 70*a* of the gap 70 extending in the first direction Y is long enough, the short circuit will be caused, thereby reducing the risk of the short circuit of the pads connected through the solder paste in the driving backplane 90. A principle of the settings in which the second boundary Ab2 located on the same side of the pad spacer region 91*a* as the second pad 912 is farther away from the pad spacer region 91*a* than the edge 912*a* of the second pad 912, the fourth boundary Cb2 located on the same side of the pad spacer region 91*a* as the first pad 911 is farther away from the pad spacer region 91*a* than the edge 911*a* of the first pad 911, and the fourth boundary Cb2 located on the same side of the pad spacer region 91*a* as the second pad 912 is farther away from the pad spacer region 91*a* than the edge 912*a* of the second pad 912, is as described above, which will not be repeated here.

In some embodiments, referring again to FIG. 17A, in the two opposite second boundaries Ab2 of the first line hollowed-out region 92*a*1 in the first direction Y and the two opposite fourth boundaries Cb2 of the second line hollowed-out region 92*a*2 in the first direction Y, a distance d10 in the first direction Y between the second boundary Ab2 located on the same side of the pad spacer region 91*a* as the first pad 911 and the edge 911*a* of the first pad 911 away from the pad spacer region 91*a* is in a range from 0.04 mm to 0.06 mm, and a distance d11 in the first direction Y between the fourth boundary Cb2 located on the same side of the pad spacer region 91*a* as the first pad 911 and the edge 911*a* of the first pad 911 away from the pad spacer region 91*a* is in a range from 0.04 mm to 0.06 mm, that is, d10 is greater than or equal to 0.04 mm and less than or equal to 0.06 mm (0.06 mm≥d10>0.04 mm), and d11 is greater than or equal to 0.04 mm and less than or equal to 0.06 mm (0.06 mm≥d11>0.04 mm); a distance d12 in the first direction Y between the second boundary Ab2 located at the same side of the pad spacer region 91*a* as the second pad 912 and the edge 912*a* of the second pad 912 away from the pad spacer region 91*a* is in a range from 0.04 mm to 0.06 mm, and a distance d13 in the first direction Y between the fourth boundary Cb2 located on the same side of the pad spacer region 91*a* as the second pad 912 and the edge 912*a* of the second pad 912 away from the pad spacer region 91*a* is in a range from 0.04 mm to 0.06 mm, that is, d12 is greater than or equal to 0.04 mm and less than or equal to 0.06 mm (0.06 mm≥d12≥0.04 mm), and d13 is greater than or equal to 0.04 mm and less than or equal to 0.06 mm (0.06 mm≥d13≥0.04 mm).

For example, referring again to FIG. 17A, the distance d10 in the first direction Y between the second boundary Ab2 located on the same side of the pad spacer region 91a as the first pad 911 and the edge 911a of the first pad 911 is 0.04 mm, 0.05 mm, or 0.06 mm, which is not limited here. The distance d11 in the first direction Y between the fourth boundary Cb2 located on the same side of the pad spacer region 91a as the first pad 911 and the edge 911a of the first pad 911 is 0.04 mm, 0.05 mm, or 0.06 mm, which is not limited here. The distance d12 in the first direction Y between the second boundary Ab2 located on the same side of the pad spacer region 91a as the second pad 912 and the edge 912a of the second pad 912 is 0.04 mm, 0.05 mm, or 0.06 mm, which is not limited here. The distance d13 in the first direction Y between the fourth boundary Cb2 located on the same side of the pad spacer region 91a as the second pad 912 and the edge 912a of the second pad 912 is 0.04 mm, 0.05 mm, or 0.06 mm, which is not limited here.

It will be noted that, the distance d10 in the first direction Y between the second boundary Ab2 located on the same side of the pad spacer region 91a as the first pad 911 and the edge 911a of the first pad 911, the distance d11 in the first direction Y between the fourth boundary Cb2 located on the same side of the pad spacer region 91a as the first pad 911 and the edge 911a of the first pad 911, the distance d12 in the first direction Y between the second boundary Ab2 located on the same side of the pad spacer region 91a as the second pad 912 and the edge 912a of the second pad 912, and the distance d13 in the first direction Y between the fourth boundary Cb2 located on the same side of the pad spacer region 91a as the second pad 912 and the edge 912a of the second pad 912, may be the same or different, which is not limited here. That is, d10=d11=d12=d13, or d10 d11, d11+d12 or d12≠d13, which is not limited here.

By setting 0.06 mm≥d10≥0.04 mm, 0.06 mm≥d11≥0.04 mm, 0.06 mm≥d12≥0.04 mm, and 0.06 mm>d13>0.04 mm, the length of the connection line LL2 required for the tin-connection short circuit is extended maximumly in a case where an overall size of the driving backplane 90 is reduced.

In some examples, referring again to FIG. 24, in the two opposite second boundaries Ab2 of the first line hollowed-out region 92a1 in the first direction Y, the second boundary Ab2 located on the same side of the pad spacer region 91a as the first pad 911 is closer to the pad spacer region 91a than the edge 911a of the first pad 911, and the second boundary Ab2 located on the same side of the pad spacer region 91a as the second pad 912 is closer to the pad spacer region 91a than the edge 912a of the second pad 912. The fourth boundary Cb2 located on the same side of the pad spacer region 91a as the first pad 911 is closer to the pad spacer region 91a than the edge 911a of the first pad 911; and the fourth boundary Cb2 located on the same side of the pad spacer region 91a as the second pad 912 is closer to the pad spacer region 91a than the edge 912a of the second pad 912. In this case, for example, although the length of the connection line LL2 required for the short circuit of the pads connected through the solder paste in the driving backplane 90 shown in FIG. 25 is shortened, the length of the connection line LL2 is still greater than the length of the connection line LL1, and the risk of the short circuit of the pads connected through the solder paste in the driving backplane 90 may still be reduced.

Therefore, the dimension d4 of the first line hollowed-out region 92a1 in the first direction Y and the dimension d4 of the second line hollowed-out region 92a2 in the first direction Y may be greater than the distance d14 between the edge 911a of the first pad 911 and the edge 912a of the second pad 912 in the first direction Y. Alternatively, the dimension d4 of the first line hollowed-out region 92a1 in the first direction Y and the dimension d4 of the second line hollowed-out region 92a2 in the first direction Y may also be less than the distance d14 between the edge 911a of the first pad 911 and the edge 912a of the second pad 912 in the first direction Y. As long as it is satisfied that the dimension d4 of the first line hollowed-out region 92a1 in the first direction Y and the dimension d4 of the second line hollowed-out region 92a2 in the first direction Y are greater than the dimension h of the pad spacer region 91a in the first direction Y, either of the above two cases is allowed, which is not limited here.

As can be seen from the above contents, in the structural design of the driving backplane 90 shown in FIG. 25 in the present disclosure, if the tin-connection short circuit of the driving backplane 90 occurs, the connection path (including the connection lines LL2, LL31 and LL32) needs to be formed. The connection line LL31 and the connection line LL32 each have a length equal to the dimension of the first region 611 or the third region 613 in the second direction, and the length of the connecting line LL2 is increased, which may reduce the risk of the short circuit of the pads connected through the solder paste in the driving backplane 90. By increasing the dimension d4 of the first line hollowed-out region 92a1 in the first direction Y and the dimension d4 of the second line hollowed-out region 92a2 in the first direction Y, it may facilitate a subsequent setting of increasing the length of the connection line LL2.

It will be noted that the dimension d4 of the first line hollowed-out region 92a1 in the first direction Y may be the same as or different from the dimension d4 of the second line hollowed-out region 92a2 in the first direction Y, which is not limited here.

Figure 27:
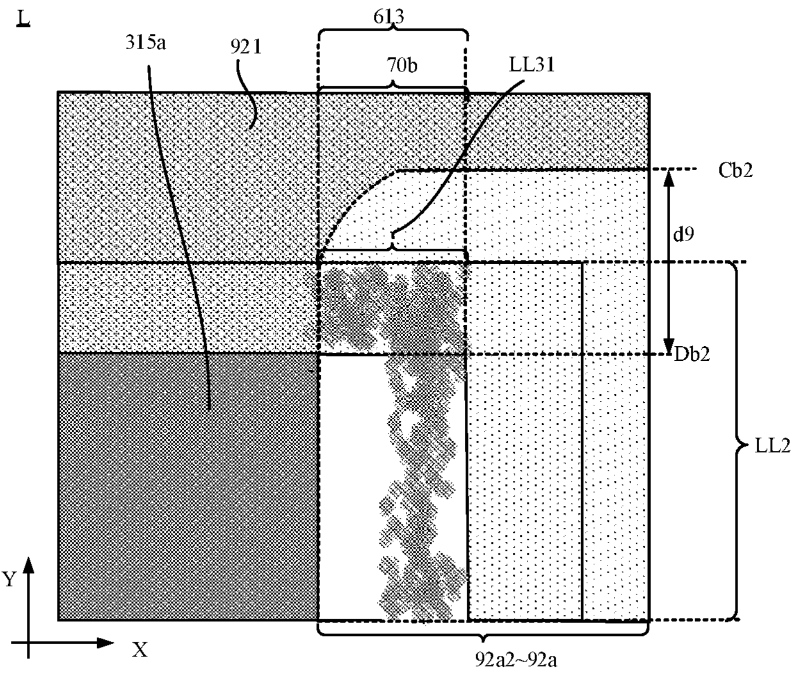
FIG. 27 is an enlarged view of part L of the driving backplane in FIG. 25, in accordance with some embodiments of the present disclosure.

It will be understood that, as shown in FIGS. 25 and 27, in a case where in the two opposite fourth boundaries Cb2 of the second line hollowed-out region 92a2 in the first direction Y, the fourth boundary Cb2 located on the same side of the pad spacer region 91a as the first pad 911 is away from the pad spacer region 91a, an end, in the second direction X, of the connection line LL31 of the formed connection path is connected to the first line 921 that is connected to the first pad 911. In this case, the connection path (including the connection lines LL2, LL31 and LL32) is connected to the first pad 911. As a result, the short circuit of the pads connected through the solder paste in the driving backplane 90 may still occur.

It will be noted that, as shown in FIG. 27, the first pad 911 and the second pad 912 are not shown; and it will be understood that a position marked as the first connection solder paste pattern 315a can be understood as a position where the first pad 911 is located, and a position marked as the second connection solder paste pattern 315b can be understood as a position where the second pad 912 is located.

In some embodiments, as shown in FIG. 17A, a dimension d15 of the first line hollowed-out region 92a1 in the second direction X is greater than 0.15 mm, and a dimensions d15 of the second line hollowed-out region 92a2 in the second direction X is greater than 0.15 mm.

For example, the dimension d15 of the first line hollowed-out region 92a1 in the second direction X may be 0.18 mm, 0.20 mm or 0.22 mm, and the dimension d15 of the second line hollowed-out region 92a2 in the second direction X may be 0.18 mm, 0.20 mm or 0.22 mm, which is not limited here.

In some examples, referring again to FIG. 23, as for the structures of the first line hollowed-out region 92*a*1 and the second line hollowed-out region 92*a*2, reference can be made to the above description, and details will not be repeated here; and as long as the dimensions of the first line hollowed-out region 92*a*1 and the second line hollowed-out region 92*a*2 in the second direction X are each greater than 0.15 mm, specific values thereof are not limited.

In a case where the dimension d5 of the first region 611 in the second direction X and the dimension d5 of the third region 613 in the second direction X are each in a range from 0.05 mm to 0.1 mm, the dimension d15 of the first line hollowed-out region 92*a*1 in the second direction X and the dimension d15 of the second line hollowed-out region 92*a*2 in the second direction X are each greater than 0.15 mm, which may ensure that the residual solder paste in portions of the gap 70 of the reflective layer 314 that are communicated to the first region 611 and the third region 613 is not connected to the line group 92 in the second direction X. Thus, the short circuit may not be caused, which reduces the risk of the short circuit.

It will be noted that the dimension d15 of the first line hollowed-out region 92*a*1 in the second direction X may be the same as or different from the dimension d15 of the second line hollowed-out region 92*a*2 in the second direction X, which is not limited here.

In some embodiments, referring again to FIG. 17A, the first line hollowed-out region 92*a*1 and the second line hollowed-out region 92*a*2 are symmetrically arranged with respect to the pad group 91.

For example, referring again to FIG. 17A, the symmetrical arrangement of the first line hollowed-out region 92*a*1 and the second line hollowed-out region 92*a*2 with respect to the pad group 91 means that the first line hollowed-out region 92*a*1 and the second line hollowed-out region 92*a*2 are symmetrically arranged in the second direction X with respect to a central axis ZZ of the pad group 91, and the first line hollowed-out region 92*a*1 and the second line hollowed-out region 92*a*2 may both be in a rectangular shape.

Since the first line hollowed-out region 92*a*1 and the second line hollowed-out region 92*a*2 are symmetrically arranged in the second direction X with respect to the central axis ZZ of the pad group 91, the dimension d4 of the first line hollowed-out region 92*a*1 in the first direction Y and the dimension d4 of the second line hollowed-out region 92*a*2 in the first direction Y are equal, and the dimension d15 of the first line hollowed-out region 92*a*1 in the second direction X and the dimension d15 of the second line hollowed-out region 92*a*2 in the second direction X are equal, which facilitates the manufacturing of the driving backplane 90. A method for manufacturing the driving backplane 90 will be described below, and details are not provided here.

In some embodiments, referring again to FIGS. 17A and 18, shapes of orthogonal projections of the first pad 911 and the second pad 912 on the substrate 311 are each rectangle.

For example, the shapes of the orthogonal projections of the first pad 911 and the second pad 912 on the substrate 311 are each square or non-square rectangle.

In some embodiments, referring again to FIG. 18, a shape of an orthogonal projection of the window region 61 on the substrate 311 is rectangle.

In some examples, referring again to FIG. 18, in a case where the orthogonal projections of the first pad 911 and the second pad 912 on the substrate 311 are in a rectangular shape, the second region 612 exposes a single pad group 91 and a pad spacer region 91*a* corresponding to the single pad group 91. Thus, the second region 612 is in a rectangular shape, and a dimension of the second region 612 in the first direction Y is equal to a distance d14 in the first direction Y between the edge 911*a* of the first pad 911 away from the pad spacer region and the edge 912*a* of the second pad 912 away from the pad spacer region 91*a*. In a case where the window region 61 is in a rectangular shape, the dimensions of the first region 611, the second region 612 and the third region 613 in the first direction Y are equal, and are each equal to the distance d14 in the first direction Y between the edge 911*a* of the first pad 911 away from the pad spacer region and the edge 912*a* of the second pad 912 away from the pad spacer region 91*a*.

In some examples, referring again to FIG. 18, the first region 611 and the third region 613 may be symmetrically arranged in the second direction X with respect to the central axis ZZ of the set of pads 91. That is, the dimension d5 of the first region 611 in the second direction X and the dimension d5 of the third region 613 in the second direction X are equal.

The first pad 911 and the second pad 912 have the same rectangular structure, and the shape of the orthogonal projection of the window region 61 on the substrate 311 is rectangular, which facilitates the manufacturing of the window region 61 of the reflective layer 314. The method for manufacturing the driving backplane 90 will be described below, and details are not provided here.

Figure 28:
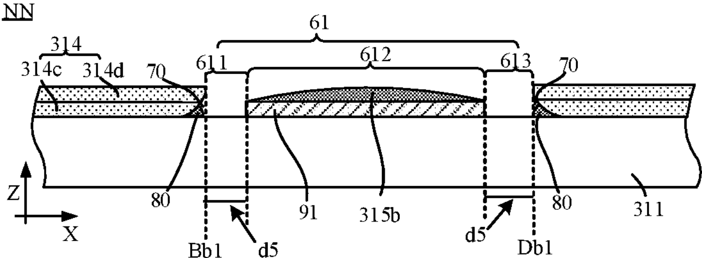
FIG. 28 is a sectional view of the driving backplane in FIG. 23 taken along the line NN, in accordance with some embodiments of the present disclosure.

In some embodiments, as shown in FIG. 28, the reflective layer 314 includes a first reflective layer 314*c* and a second reflective layer 314*d* stacked on a surface of the first reflective layer 314*c* away from the substrate 311.

For example, the first reflective layer 314*c* and the second reflective layer 314*d* are both white ink layers. Since the reflective layer 314 includes the first reflective layer 314*c* and the second reflective layer 314*d* that are stacked in the third direction Z, a thickness of the reflective layer 314 (e.g., a dimension of the reflective layer 314 in the third direction Z) may be increased, and a light reflectance of the reflective layer 314 is increased.

As described above, the reflective layer 314 has a gap 70 proximate to an edge of a window region 61, and a portion, which is proximate to the substrate 311 and proximate to the edge of the window region 61, of the material for forming the reflective layer 314 is removed to form the gap 70. Referring to FIGS. 13 and 20, the gap 70 has defined dimensions in the third direction Z and the second direction X.

In some embodiments, the driving backplane 90 further includes a protective layer. The protective layer covers the reflective layer 314 and fills in the window regions 61 and the gaps 70. Since the protective layer fills in the gaps 70, the bonding of the protective layer to the reflective layer 314 is stronger. As a result, the protective layer is not easy to fall off.

Figure 29:
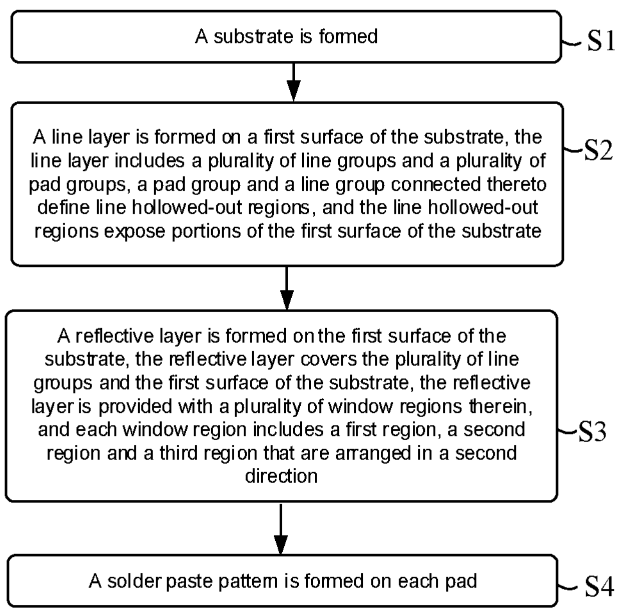
FIG. 29 is a flow diagram of a method for manufacturing a driving backplane, in accordance with some embodiments of the present disclosure.

Some embodiments of the present disclosure further provide a method for manufacturing a driving backplane. As shown in FIG. 29, the method for manufacturing the driving backplane 90 (referring to FIG. 16) includes following steps.

In S1, a substrate 311 is formed.

For example, the substrate 311 includes an FR4 board (a double-sided copper-clad PCB formed by laminating epoxy resin and glass cloth), a BT (a thermosetting resin formed by using bismaleimide and triazine as main resin components and adding epoxy resin, polyphenylene oxide resin or allyl compound as a modifying component) board, an FPC, or glass, which is not limited here.

In S2, as shown in FIG. 16, a line layer is formed on a first surface 311*a* of the substrate 311, and the line layer includes a plurality of line groups 92 and a plurality of pad groups 91. The plurality of pad groups 91 are arranged in an array on the first surface 311*a* of the substrate 311, and each pad group 91 includes two pads spaced apart in a first direction Y. The two pads have a pad spacer region 91*a* therebetween. The plurality of line groups 92 are disposed on the first surface 311*a* of the substrate 311, each line group 92 includes two lines, and a line of each line group 92 is connected to a pad of a pad group 91. As shown in FIGS. 17A and 17B, at least one pad of the pad group 91 and a line of a line group 92 connected thereto define line hollowed-out regions 92*a*, and the line hollowed-out regions 92*a* include a first line hollowed-out region 92*a*1 and a second line hollowed-out region 92*a*2. The first line hollowed-out region 92*a*1 and the second line hollowed-out region 92*a*2 are disposed on two sides of the pad(s) in a second direction X, respectively. Dimensions d4 of the first line hollowed-out region 92*a*1 and the second line hollowed-out region 92*a*2 in the first direction Y are each greater than a dimension h of the pad spacer region 91*a* corresponding to the pad group 91 in the first direction Y. The second direction X is perpendicular to the first direction Y, and the second direction X and the first direction Y are parallel to the first surface 311*a* of the substrate 311.

For example, a metal material layer may be formed by using a process such as sputtering, evaporation or chemical vapor deposition, and then the metal material layer is etched, so as to form the line layer on the first surface 311*a* of the substrate 311.

In some examples, as shown in FIG. 17A, each pad group 91 includes a first pad 911 and a second pad 912 that are spaced apart in the first direction Y, and each line group 92 includes a first line 921 and a second line 922. A first pad 911 of a single pad group 91 is connected to a first line 921 of a single line group 92, and a second pad 912 of the single pad group 91 is connected to a second line 922 of the single line group 92. The first line hollowed-out region 92*a*1 is located on a left side of the pad group 91 in the second direction X, and the second line hollowed-out region 92*a*2 is located on a right side of the pad group 91 in the second direction X. An end of the first pad 911 away from the pad spacer region 91*a* is connected to the first line 921, and an end of the second pad 912 away from the pad spacer region 91*a* is connected to the second line 922.

It will be noted that both the first pad 911 and the second pad 912 are processed by using an ENIG process or an OSP process, so as to improve anti-oxidation function and soldering performance of the first pad 911 and the second pad 912.

In S3, as shown in FIG. 18, a reflective layer 314 is formed on the first surface 311*a* of the substrate 311, the reflective layer 314 covers the first surface 311*a* of the substrate 311 and the plurality of line groups 92, and the reflective layer 314 is provided with a plurality of window regions 61 therein, each window region 61 includes a first region 611, a second region 612 and a third region 613 that are arranged in the second direction X. The second region 612 exposes a pad group 91 and a pad spacer region 91*a* corresponding to the pad group 91. The first region 611 and the third region 613 expose portions of the first surface 311*a* of the substrate 311. In the second direction X, a boundary Ab1 of an orthogonal projection of the first line hollowed-out region 92*a*1 on the substrate 311 away from the pad group 91 is farther away from the pad group 91 than a boundary Bb1 of an orthogonal projection of the first region 611 on the substrate 311 away from the pad group 91. In the second direction X, a boundary Cb1 of an orthogonal projection of the second line hollowed-out region 92*a*2 on the substrate 311 away from the pad group 91 is farther away from the pad group 91 than a boundary Db1 of an orthogonal projection of the third region 613 on the substrate 311 away from the pad group 91.

For example, the reflective layer 314 is formed through an ink printing process, and the plurality of window regions 61 are formed in the reflective layer 314 through irradiation of ultraviolet (UV) light.

In S4, as shown in FIG. 21, a connection solder paste pattern is formed on each pad. The connection solder paste pattern may be a first connection solder paste pattern or a second connection solder paste pattern.

For example, by providing a stencil on the driving backplane 90, solder paste on the stencil is scraped off to a corresponding pad by a scraper.

Figure 30:
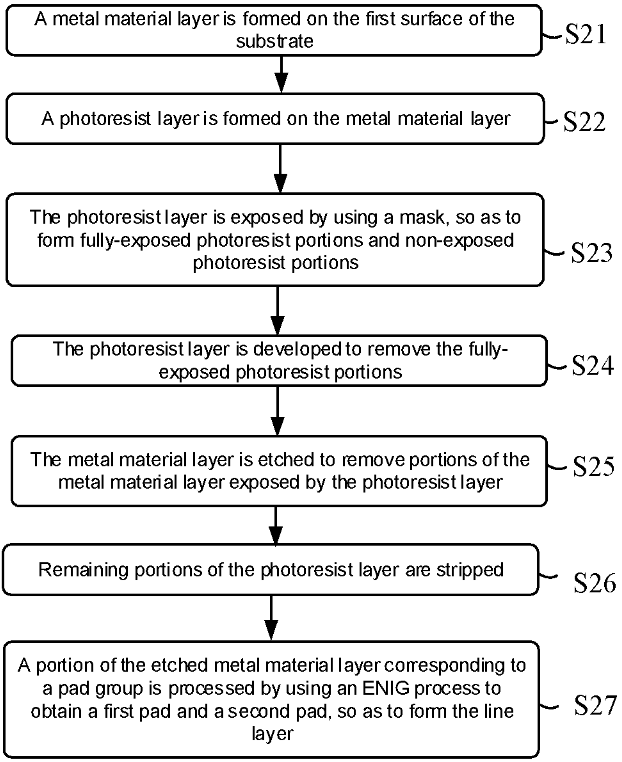
FIGS. 30 to 32 and 34 to 37 are diagrams showing steps of S2 of a method for manufacturing a driving backplane, in accordance with some embodiments of the present disclosure.

In some examples, considering the method for manufacturing the driving backplane 90 shown in FIG. 25 as an example, the step S2 of forming the line layer on the first surface 311*a* of the substrate 311, as shown in FIG. 30, includes S21 to S27.

Figure 31:
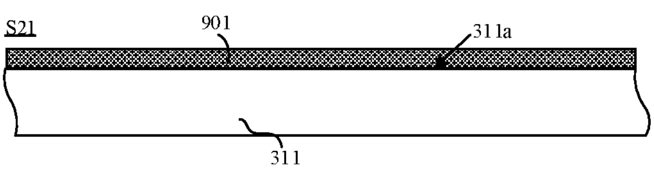

In S21, as shown in FIG. 31, a metal material layer 901 is formed on the first surface 311*a* of the substrate 311.

For example, a material of the metal material layer 901 includes silver (Ag), magnesium (Mg), calcium (Ca), lithium (Li), etc.

Figure 32:
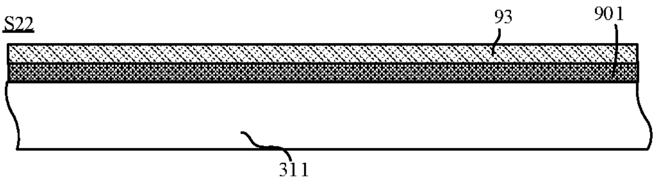

In S22, as shown in FIG. 32, a photoresist layer 93 is formed on the metal material layer 901.

For example, the photoresist layer 93 is made of polyimide; and a photoresist material is coated on the metal material layer 901 by using a coating process to form the photoresist layer 93.

Figure 33:
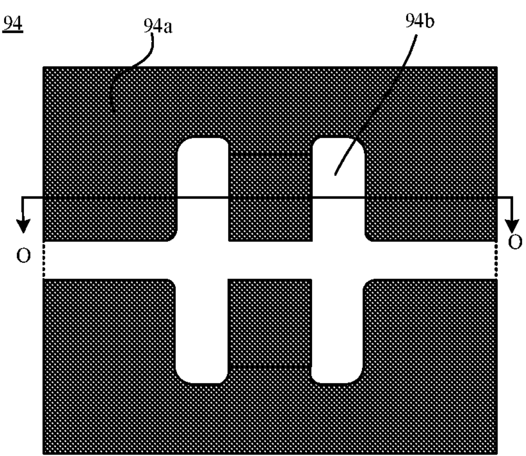
FIG. 33 is a partial structural diagram of a mask, in accordance with some embodiments of the present disclosure.
Figure 34:
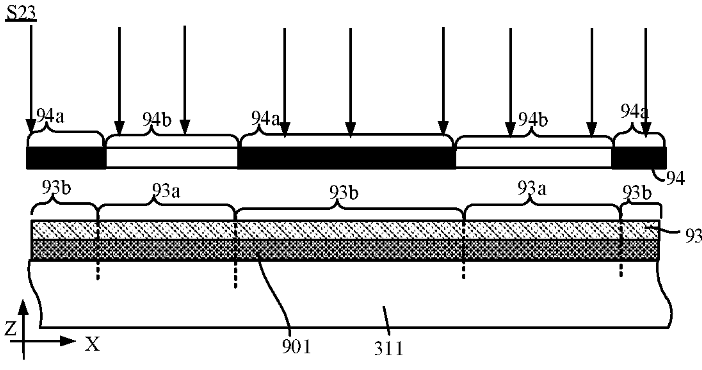

In S23, as shown in FIG. 34, the photoresist layer 93 is exposed by using a mask 94, and the photoresist layer 93 is formed into fully-exposed photoresist portions 93*a* and non-exposed photoresist portions 93*b*. A partial structure of the mask 94 is as shown in FIG. 33, and a view of the mask 94 shown in FIG. 34 is a sectional view of the mask 94 taken along the section line OO in FIG. 33.

For example, the mask 94 includes light-shielding regions 94*a* and openings 94*b*. The light shielding region 94*a* blocks transmission of light, and corresponds to the non-exposed photoresist portion 93*b* of the photoresist layer 93; and the opening 94*b* does not block light, and corresponds to the fully-exposed photoresist portion 93*a* of the photoresist layer 93. After the photoresist layer 93 is exposed, the fully-exposed photoresist portion 93*a* and the non-exposed photoresist portion 93*b* are respectively formed at positions corresponding to the opening 94*b* and the light shielding region 94*a* of the mask 94.

It will be noted that the above description A "corresponds to" B means that orthogonal projections of A and B on the substrate 311 coincide.

Figure 35:
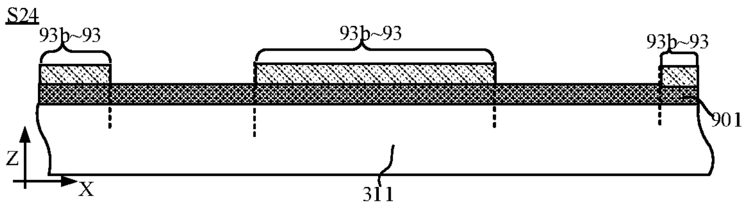

In S24, as shown in FIG. 35, the photoresist layer 93 is developed to remove the fully-exposed photoresist portions 93*a*.

For example, the photoresist layer 93 is developed by using a developing solution, and the fully-exposed photoresist portions 93*a* are completely removed and the non-exposed photoresist portions 93*b* are completely remained.

Figure 36:
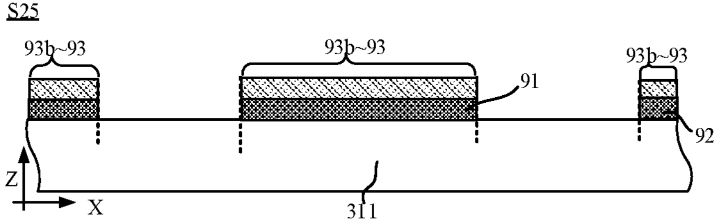

In S25, as shown in FIG. 36, the metal material layer 901 is etched to remove portions of the metal material layer 901 exposed by the photoresist layer 93, so that portions of the first surface 311*a* of the substrate 311 are exposed. After the portions of the first surface 311*a* of the substrate 311 are exposed, the pad spacer region 91*a* and the line hollowed-out regions 92*a* are formed.

Figure 37:
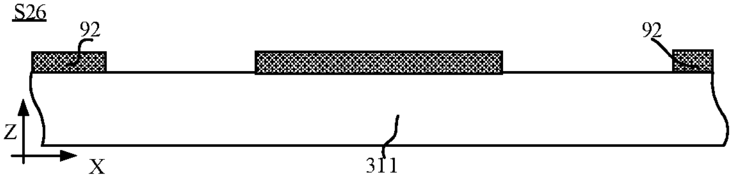

In S26, as shown in FIG. 37, remaining portions of the photoresist layer 93 are stripped.

The remaining portions of the photoresist layer 93 are the non-exposed photoresist portions 93*b*.

In S27, a portion of the etched metal material layer 901 corresponding to the pad group 91 is processed by using the ENIG process to obtain the first pad 911 and the second pad 912, so as to form the line layer. The formed structure is as shown in FIG. 17A.

Figure 38:
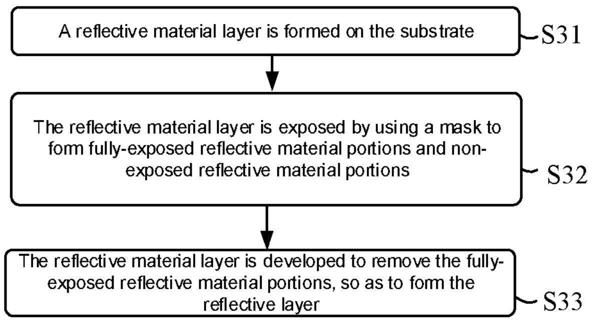
FIGS. 38 to 40 are diagrams showing steps of S3 of a method for manufacturing a driving backplane, in accordance with some embodiments of the present disclosure.

In some examples, considering the method for manufacturing the driving backplane 90 shown in FIG. 25 as an example, the step S3 of forming the reflective layer 314 on the first surface 311*a* of the substrate 311, as shown in FIG. 38, includes S31 to S33.

Figure 39:
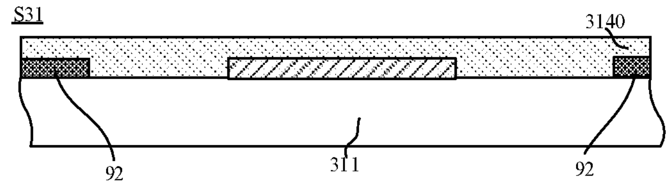

In S31, as shown in FIG. 39, a reflective material layer 3140 is formed on the substrate 311.

For example, a material of the reflective material layer 3140 includes white ink, and the reflective material layer 3140 is formed by using the ink printing process.

Figure 40:
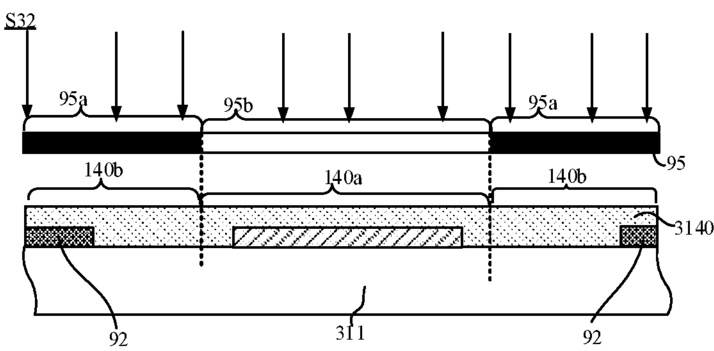

In S32, as shown in FIG. 40, the reflective material layer 3140 is exposed by using a mask 95, so as to form fully-exposed reflective material portions 140*a* and non-exposed reflective material portions 140*b*.

For example, the mask 95 includes light shielding regions 95*a* and openings 95*b*. After the reflective material layer 3140 is exposed, the fully-exposed reflective material portion 140*a* and the non-exposed reflective material portion 140*b* are respectively formed at positions corresponding to the opening 95*b* and the light shielding region 95*a* of the mask 95.

In S33, the reflective material layer 3140 is developed to remove the fully-exposed reflective material portions 140*a*, so as to form the reflective layer 314. A position of the fully-exposed reflective material portion 140*a* corresponds to a position of the window region 61 of the reflective layer 314, and the structure is as shown in FIG. 18.

In some embodiments, as shown in FIG. 28, the step S3 of forming the reflective layer 314 on the first surface 311*a* of the substrate 311 includes forming a first reflective layer 314*c* on the first surface 311*a* of the substrate 311 and forming a second reflective layer 314*d* on a surface of the first reflective layer 314*c* away from the first surface 311*a*.

For example, after two reflective material layers 3140 are formed by using the ink printing process, step S32 is performed to form window regions 61 in the two reflective material layers 3140, so as to obtain a structure having the first reflective layer 314*c* and the second reflective layer 314*d*. In this way, a thickness of the reflective layer 314 is increased, and a light reflectance of the reflective layer 314 is improved.

It will be noted that the reflective layer 314 may be formed by one reflective material layer, two reflective material layers, or three reflective material layers, which is not limited here.

Beneficial effects of the method for manufacturing the driving backplane are the same as the beneficial effects of the driving backplane provided in the embodiments of the present disclosure, and details will not be repeated here.

Figure 41:
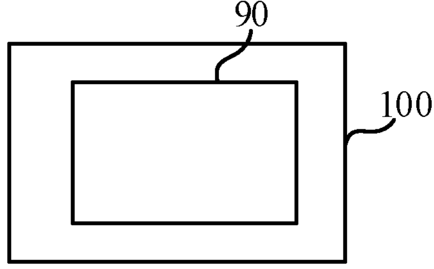
FIG. 41 is a structural diagram of a display device, in accordance with some embodiments of the present disclosure.

Some embodiments of the present disclosure further provide a display device. As shown in FIG. 41, the display device 100 includes the driving backplane 90 as described above. The display device is, for example, a liquid crystal display device, and the driving backplane is disposed in a BLU of the liquid crystal display device. With regard to a relevant structure of the display device, reference may be made to the structures shown in FIGS. 1 to 6 and relevant descriptions in the foregoing.

The display device provided in the embodiments of the present disclosure may be any device that displays an image, whether in motion (e.g., a video) or stationary (e.g., a still image), and whether textual or pictorial. More specifically, it is contemplated that the embodiments may be implemented in or associated with a variety of electronic devices such as, but not limited to, mobile phones, wireless devices, personal data assistants (PDAs), hand-held or portable computers, GPS receivers/navigators, cameras, MP4 video players, camcorders, game consoles, watches, clocks, calculators, television monitors, flat panel displays, computer monitors, automotive displays (e.g., odometer displays, etc.), navigators, cockpit controllers and/or displays, displays of camera views (e.g., displays of rear view cameras in vehicles), electronic photographs, electronic billboards or signs, projectors, architectural structures, packaging and aesthetic structures (e.g., displays of images for a piece of jewelry), etc.

Beneficial effects of the display device are the same as the beneficial effects of the driving backplane provided in the embodiments of the present disclosure, and details will not be repeated here.

The foregoing descriptions are merely specific implementation manners of the present disclosure, but the protection scope of the present disclosure is not limited thereto. Changes or replacements that any person skilled in the art could readily conceive of within the technical scope of the present disclosure shall all be included in the protection scope of the present disclosure. Therefore, the protection scope of the present disclosure shall be subject to the protection scope of the claims.

What is claimed is:

1. A driving backplane, comprising:

a substrate;

a plurality of pad groups arranged in an array on a first surface of the substrate, wherein each of the plurality of pad groups includes two pads spaced apart in a first direction, and the two pads have a pad spacer region therebetween;

a plurality of line groups disposed on the first surface of the substrate, each line group including two lines, a line of each line group being connected to a pad of a single pad group, wherein at least one pad of a pad group of the plurality of pad groups and a line connected thereto define line hollowed-out regions, and the line hollowed-out regions include a first line hollowed-out region and a second line hollowed-out region; the first line hollowed-out region and the second line hollowed-out region are disposed on two sides of the at least one pad in a second direction, respectively; dimensions of the first line hollowed-out region and the second line hollowed-out region in the first direction are each greater than a dimension of a pad spacer region corresponding to the pad group in the first direction; and the second direction is perpendicular to the first direction, and the second direction and the first direction are parallel to the first surface of the substrate; and a reflective layer covering the first surface of the substrate and the plurality of line groups, wherein the reflective layer is provided with a plurality of window regions therein, and each window region includes a first region, a second region and a third region that are arranged in the second direction; the second region exposes a respective pad group and a pad spacer region corresponding to the respective pad group; the first region and the third region expose portions of the first surface of the substrate; in the second direction, a boundary of an orthogonal projection of the first line hollowed-out region on the substrate away from the respective pad group is farther away from the respective pad group than a boundary of an orthogonal projection of the first region on the substrate away from the respective pad group; and in the second direction, a boundary of an orthogonal projection of the second line hollowed-out region on the substrate away from the respective pad group is farther away from the respective pad group than a boundary of an orthogonal projection of the third region on the substrate away from the respective pad group; wherein a distance in the second direction between the boundary of the orthogonal projection of the first line hollowed-out region on the substrate away from the pad group and the boundary of the orthogonal projection of the first region on the substrate away from the pad group is greater than 1.2 times a distance in a third direction between a surface of the reflective layer away from the substrate and the first surface of the substrate;

a distance in the second direction between the boundary of the orthogonal projection of the second line hollowed-out region on the substrate away from the pad group and the boundary of the orthogonal projection of the third region on the substrate away from the pad group is greater than 1.2 times the distance in the third direction between the surface of the reflective layer away from the substrate and the first surface of the substrate; and the third direction is perpendicular to the first surface of the substrate.

2. The driving backplane according to claim 1, wherein the line hollowed-out regions are defined by two pads of the pad group and a line group connected thereto; and the first line hollowed-out region and the second line hollowed-out region are disposed on two sides of the pad group in the second direction, respectively.

3. The driving backplane according to claim 1, wherein a dimension of the first region in the second direction is in a range from 0.05 mm to 0.1 mm, and a dimension of the third region in the second direction is in a range from 0.05 mm to 0.1 mm.

4. The driving backplane according to claim 1, wherein two opposite second boundaries of the first line hollowed-out region in the first direction are farther away from the pad spacer region corresponding to the pad group than two opposite first boundaries of the orthogonal projection of the first region on the substrate in the first direction; and two opposite fourth boundaries of the second line hollowed-out region in the first direction are farther away from the pad spacer region corresponding to the pad group than two opposite third boundaries of the orthogonal projection of the third region on the substrate in the first direction.

5. The driving backplane according to claim 4, wherein a distance in the first direction between a first boundary of the two opposite first boundaries and a second boundary of the two opposite second boundaries on a same side of the pad spacer region corresponding to the pad group is greater than 1.2 times a distance in a third direction between a surface of the reflective layer away from the substrate and the first surface of the substrate, the third direction being perpendicular to the first surface of the substrate; and/or a distance in the first direction between a third boundary of the two opposite third boundaries and a fourth boundary of the two opposite fourth boundaries on a same side of the pad spacer region corresponding to the pad group is greater than 1.2 times the distance in the third direction between the surface of the reflective layer away from the substrate and the first surface of the substrate.

6. The driving backplane according to claim 4, wherein the two pads of each of the plurality of pad groups are a first pad and a second pad;

in the two opposite second boundaries of the first line hollowed-out region in the first direction, a second boundary located on a same side of the pad spacer region corresponding to the pad group as a first pad of the pad group is farther away from the pad spacer region corresponding to the pad group than an edge of the first pad of the pad group away from the pad spacer region corresponding to the pad group; and/or another second boundary located on a same side of the pad spacer region corresponding to the pad group as a second pad of the pad group is farther away from the pad spacer region corresponding to the pad group than an edge of the second pad of the pad group away from the pad spacer region corresponding to the pad group; and/or in the two opposite fourth boundaries of the first line hollowed-out region in the first direction, a fourth boundary located on a same side of the pad spacer region corresponding to the pad group as the first pad of the pad group is farther away from the pad spacer region corresponding to the pad group than the edge of the first pad of the pad group away from the pad spacer region corresponding to the pad group; and/or another fourth boundary located on a same side of the pad spacer region corresponding to the pad group as the second pad of the pad group is farther away from the pad spacer region corresponding to the pad group than the edge of the second pad of the pad group away from the pad spacer region corresponding to the pad group.

7. The driving backplane according to claim 6, wherein a distance in the first direction between the second boundary located on the same side of the pad spacer region corresponding to the pad group as the first pad of the pad group and the edge of the first pad of the pad group away from the pad spacer region corresponding to the pad group, and a distance in the first direction between the fourth boundary located on the same side of the pad spacer region corresponding to the pad group as the first pad of the pad group and the edge of the first pad of the pad group away from the pad spacer region corresponding to the pad group, are each in a range from 0.04 mm to 0.06 mm; and/or a distance in the first direction between the another second boundary located on the same side of the pad spacer region corresponding to the pad group as the second pad of the pad group and the edge of the second pad of the pad group away from the pad spacer region corresponding to the pad group, and a distance in the first direction between the another fourth boundary located on the same side of the pad spacer region corresponding to the pad group as the second pad of the pad group and the edge of the second pad of the pad group away from the pad spacer region corresponding to the pad group, are each in a range from 0.04 mm to 0.06 mm.

8. The driving backplane according to claim 7, wherein dimensions of the first line hollowed-out region and the second line hollowed-out region in the second direction are each greater than 0.15 mm.

9. The driving backplane according to claim 1, wherein dimensions of the first line hollowed-out region and the second line hollowed-out region in the second direction are each greater than 0.15 mm.

10. The driving backplane according to claim 1, wherein the first line hollowed-out region and the second line hollowed-out region are symmetrically arranged with respect to the pad group.

11. The driving backplane according to claim 1, wherein the two pads are a first pad and a second pad, and shapes of orthogonal projections of the first pad and the second pad on the substrate are both rectangle.

12. The driving backplane according to claim 11, wherein a shape of an orthogonal projection of the window region on the substrate is rectangle.

13. The driving backplane according to claim 1, wherein the two pads are a first pad and a second pad; and the driving backplane further comprises:

a plurality of first connection solder paste patterns, each first connection solder paste pattern covering a respective first pad; and a plurality of second connection solder paste patterns, each second connection solder paste pattern covering a respective second pad.

14. The driving backplane according to claim 13, further comprising a plurality of light-emitting chips, each light-emitting chip being electrically connected to respective one of the plurality of pad groups by a single first connection solder paste pattern and a single second connection solder paste pattern.

15. The driving backplane according to claim 1, wherein the reflective layer includes a first reflective layer and a second reflective layer that are stacked on a surface of the first reflective layer away from the substrate.

16. The driving backplane according to claim 1, wherein the reflective layer has a gap proximate to an edge of the window region; a maximum dimension of the gap in a third direction is ½ to ⅔ of a thickness of the reflective layer, and a dimension of the gap in the second direction is 1.1 to 1.2 times the thickness of the reflective layer; and the third direction is a direction perpendicular to the first surface of the substrate.

17. A display device, comprising the driving backplane according to claim 1.

18. A method for manufacturing a driving backplane, the method comprising:

forming a substrate;

forming a line layer on a first surface of the substrate, wherein the line layer includes a plurality of line groups and a plurality of pad groups; the plurality of pad groups are arranged in an array on the first surface of the substrate, and each of the plurality of pad groups includes two pads spaced apart in a first direction; the two pads have a pad spacer region therebetween; the plurality of line groups are disposed on the first surface of the substrate, each line group includes two lines, and a line of each line group is connected to a pad of a single pad group; at least one pad of a pad group of the plurality of pad groups and a line of a line group connected thereto define line hollowed-out regions, and the line hollowed-out regions include a first line hollowed-out region and a second line hollowed-out region; the first line hollowed-out region and the second line hollowed-out region are disposed on two sides of the at least one pad in a second direction, respectively; dimensions of the first line hollowed-out region and the second line hollowed-out region in the first direction are each greater than a dimension of a pad spacer region corresponding to the pad group in the first direction; and the second direction is perpendicular to the first direction, and the second direction and the first direction are parallel to the first surface of the substrate;

forming a reflective layer on the first surface of the substrate, wherein the reflective layer covers the first surface of the substrate and the plurality of line groups, the reflective layer is provided with a plurality of window regions therein, and each window region includes a first region, a second region and a third region that are arranged in the second direction; the second region exposes a respective pad group and a pad spacer region corresponding to the respective pad group; the first region and the third region expose portions of the first surface of the substrate; in the second direction, a boundary of an orthogonal projection of the first line hollowed-out region on the substrate away from the respective pad group is farther away from the respective pad group than a boundary of an orthogonal projection of the first region on the substrate away from the respective pad group; and in the second direction, a boundary of an orthogonal projection of the second line hollowed-out region on the substrate away from the respective pad group is farther away from the respective pad group than a boundary of an orthogonal projection of the third region on the substrate away from the respective pad group; and forming a connection solder paste pattern on each pad; wherein a distance in the second direction between the boundary of the orthogonal projection of the first line hollowed-out region on the substrate away from the pad group and the boundary of the orthogonal projection of the first region on the substrate away from the pad group is greater than 1.2 times a distance in a third direction between a surface of the reflective layer away from the substrate and the first surface of the substrate;

a distance in the second direction between the boundary of the orthogonal projection of the second line hollowed-out region on the substrate away from the pad group and the boundary of the orthogonal projection of the third region on the substrate away from the pad group is greater than 1.2 times the distance in the third direction between the surface of the reflective layer away from the substrate and the first surface of the substrate; and the third direction is perpendicular to the first surface of the substrate.

19. The method according to claim 18, wherein forming the reflective layer on the first surface of the substrate includes:

forming a first reflective layer on the first surface of the substrate; and forming a second reflective layer on a surface of the first reflective layer away from the first surface.

* * * * *